(12) United States Patent
Okita

(10) Patent No.: US 10,065,208 B2
(45) Date of Patent: Sep. 4, 2018

(54) DISCHARGE DETERMINATION METHOD AND DISCHARGE APPARATUS

(71) Applicant: SCREEN Holdings Co., Ltd., Kyoto (JP)

(72) Inventor: Yuji Okita, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/343,911

(22) Filed: Nov. 4, 2016

(65) Prior Publication Data
US 2017/0128978 A1    May 11, 2017

(30) Foreign Application Priority Data

Nov. 10, 2015 (JP) .................................. 2015-220089

(51) Int. Cl.
| | | |
|---|---|---|
| *B05D 1/02* | (2006.01) | |
| *B05C 1/00* | (2006.01) | |
| *H01L 21/67* | (2006.01) | |

(52) U.S. Cl.
CPC .................. *B05D 1/02* (2013.01); *B05C 1/00* (2013.01); *H01L 21/67051* (2013.01); *H01L 21/67253* (2013.01)

(58) Field of Classification Search
None
See application file for complete search history.

(56) References Cited

U.S. PATENT DOCUMENTS

| | | | |
|---|---|---|---|
| 2010/0045731 A1* | 2/2010 | Kim ..................... | B41J 2/04561 347/19 |
| 2011/0286738 A1 | 11/2011 | Noda et al. ................... | 396/611 |
| 2013/0202188 A1* | 8/2013 | Urano ................. | G06K 9/6202 382/149 |

FOREIGN PATENT DOCUMENTS

| | | |
|---|---|---|
| JP | 2002-316080 | 10/2002 |
| JP | 2009-095826 | 5/2009 |
| JP | 2012-009812 | 1/2012 |
| JP | 2013-206983 | 10/2013 |

OTHER PUBLICATIONS

Office Action dated Nov. 9, 2017 in corresponding Taiwanese Patent Application No. 105135483.

* cited by examiner

*Primary Examiner* — Nathan T Leong
(74) *Attorney, Agent, or Firm* — Ostrolenk Faber LLP

(57) ABSTRACT

Whether or not a liquid is discharged from a nozzle is determined from an image. An index value larger in a discharge state than in a non-discharge state is calculated from an evaluation area including a path of the liquid. The discharge state or the non-discharge state is determined according to a relationship between the index value and a reference value. The reference value is determined according to a histogram of index values obtained from a plurality of images collected in advance. When an evaluation value indicating a peak position or the sharpness of a peak is smaller than a predetermined threshold value in the histogram, the collected images are assumed to show the non-discharge state. When the evaluation value is larger than the threshold value, the collected images are assumed to show the discharge state. Thus, the reference value is set for the discharge state and the non-discharge state.

7 Claims, 18 Drawing Sheets

FIG. 11A
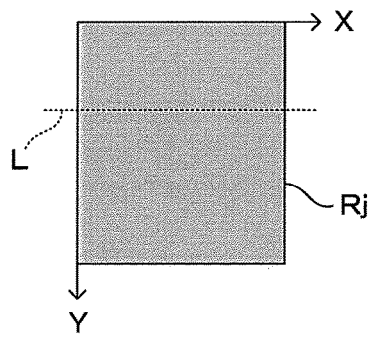
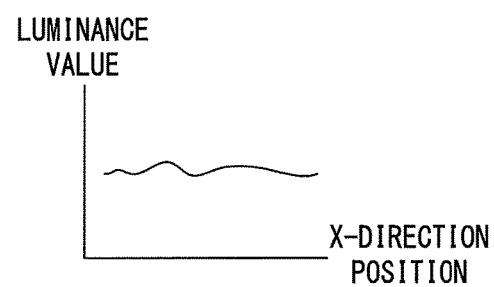
FIG. 11B
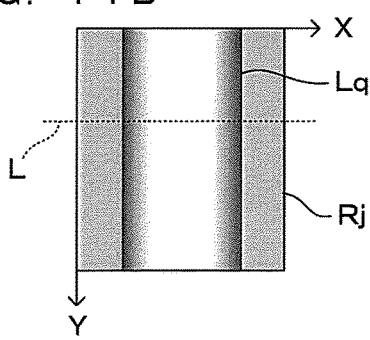
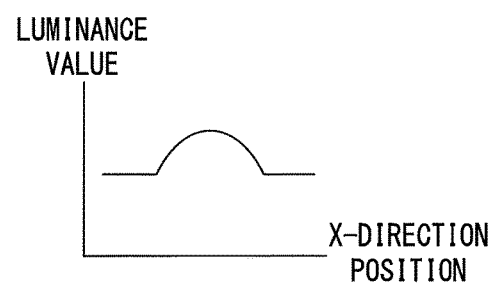
FIG. 11C
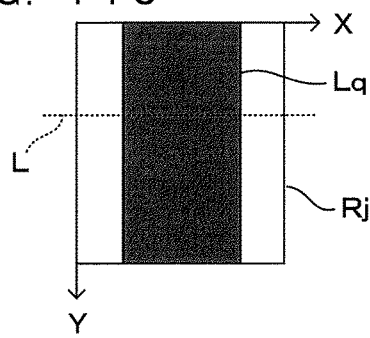
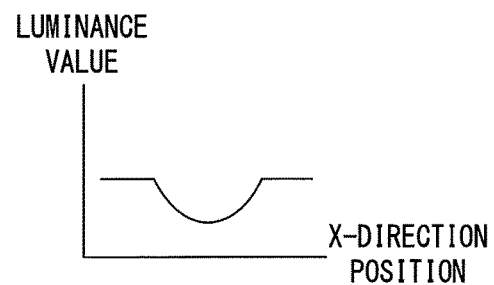

LUMINANCE SUMMATION VALUE
INTEGRATED IN Y DIRECTION $S(i) = \sum_{j=0}^{y} Pij$

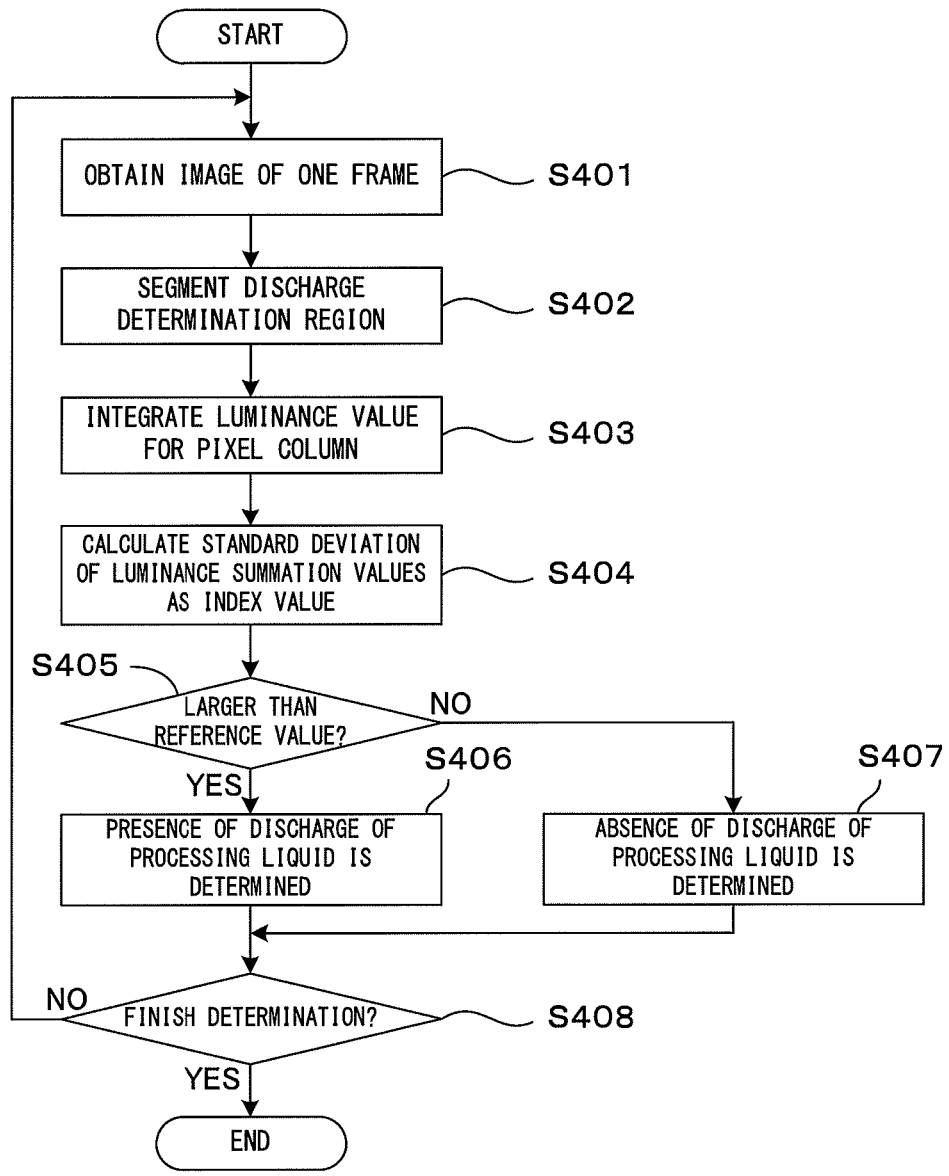

DISCHARGE DETERMINATION METHOD AND DISCHARGE APPARATUS

CROSS REFERENCE TO RELATED APPLICATION

The disclosure of Japanese Patent Application No. 2015-220089 filed on Nov. 10, 2015 including specification, drawings and claims is incorporated herein by reference in its entirety.

BACKGROUND OF THE INVENTION

1. Field of the Invention

This invention relates to a technique for determining a discharge state where liquid is discharged from a nozzle and a non-discharge state where the liquid is not discharged.

2. Description of the Related Art

In a technique in which processing is performed by supplying liquid to a processing object (work) such as a substrate for example, it is necessary in some cases to monitor whether or not a predetermined amount of the liquid is supplied at a predetermined timing. A technique for determining whether or not liquid is discharged from a nozzle is, for example, described in each literature below.

In a technique described in JP2002-316080A, a discharge port of a nozzle is imaged by a camera. A background plate is provided at a position corresponding to the background of the nozzle when viewed from the camera and a moment of starting the discharge is detected by a change in shading appearing in an image. Further, a technique described in JP2009-095826A is a technique for inspecting a nozzle, and a thickness of a liquid column discharged in a column-like manner from the nozzle is optically detected. Specifically, reflected light of light irradiated toward the liquid column is imaged, a discharge amount (thickness of the liquid column) is determined from a luminance average value of the imaged image and the presence or absence of a variation of the discharge amount is determined from a luminance variation amount. Further, in a technique described in JP2012-009812A, a liquid column which becomes luminous by the reflection of illumination light by the liquid column is imaged. The presence or absence of the discharge, a discharge amount and the like are determined by comparing that image and reference information prepared in advance.

In each of the above conventional techniques, the discharge is determined utilizing a change of the content of an imaged image depending on the presence or absence of the discharge. However, since the processing is required to be even faster, it has become difficult to utilize such determination techniques. For example, in a configuration in which the discharge of liquid is started after a movable nozzle is positioned at a predetermined position, the start of the discharge of the liquid can be detected from a change of an image from a reference image after the positioning of the nozzle and before the discharge of the liquid. In contrast, it has also recently become necessary to discharge liquid during a movement of a nozzle or substantially simultaneously with the completion of positioning. Thus, in such a configuration, it is difficult to prepare a reference image to be compared. Further, a liquid discharge time has also become shorter for faster processing and the saving of processing liquid.

Thus, a technique has been required which can reliably determine a state of liquid from an image imaged at a certain time without depending on a comparison with an image before or after the former image or a reference image.

SUMMARY OF THE INVENTION

This invention was developed in view of the above problem and an object thereof is to provide a technique capable of reliably determining in a short time from an imaged image whether or not liquid is discharged from a nozzle.

One aspect of this invention is directed to a discharge determination method for determining whether a discharge state where liquid is discharged from a nozzle or a non-discharge state where the liquid is not discharged from the nozzle is set. In order to achieve the above object, the discharge determination method includes performing imaging with at least a part of a flow-down path in which the liquid discharged from the nozzle flows included in an imaging field of view, obtaining an index value having larger in the discharge state than in the non-discharge state based on pixel values of pixels in an evaluation area including at least a part of the flow-down path out of an imaged image, and determining that the image indicates the discharge state if the index value is larger than a reference value which is determined in advance while determining that the image indicates the non-discharge state if the index value is smaller than the reference value.

In such a discharge determination method, the index value having a larger value in the discharge state than in the non-discharge state is determined from the pixel values of the pixels in the evaluation area obtained by imaging the flow-down path of the liquid. The discharge state is determined if the index value obtained from the image is larger than the reference value determined in advance, whereas the non-discharge state is determined if it is smaller.

To accurately determine the discharge state and the non-discharge state, the reference value determined for the index value needs to be proper. If there are many images imaged for each of the discharge state and the non-discharge state, a threshold value can be obtained which can clearly divide the discharge state and the non-discharge state by obtaining the index value from the evaluation area of each of those images and statistically processing those index values. However, there are cases where it is difficult to collect such images beforehand. Particularly, images of the discharge state need to be imaged in a state where the liquid is actually discharged from the nozzle. However, such as when the liquid is, for example, expensive drug or corrosive, it is not allowed to discharge the liquid for imaging. Even in such a case, it is required to properly set the reference value.

Accordingly, the reference value in the invention is determined based on a histogram indicated by the index values obtained for the evaluation area of each of a plurality of images including the evaluation areas imaged at mutually different times. Specifically, when the histogram exhibits unimodality, the reference value is determined as follows. If an evaluation value indicated by either the index value corresponding to the position of a peak or a value indicating the sharpness of the peak is smaller than a threshold value determined in advance, a value corresponding to a substantially maximum value of the index values in the histogram is set as the reference value. On the other hand, if the evaluation value is larger than the threshold value, a value corresponding to a substantially minimum value of the index values in the histogram is set as the reference value.

If the plurality of images include both images obtained by imaging the discharge state and those obtained by imaging the non-discharge state, the histogram indicated by index values obtained from those images is thought to exhibit bimodality including both a peak corresponding to the discharge state and a peak corresponding to the non-discharge state. In this case, two states can be divided by providing the reference value between the both peaks.

On the other hand, if the plurality of images include only images of either the discharge state or the non-discharge state, the histogram exhibits unimodality. In this case, how to judge to which of the discharge state and the non-discharge state a single peak in the histogram corresponds and how to set the reference value according to that judgment result are problematic.

In the invention, attention is focused on a knowledge that a variation of image content in the evaluation area with time is relatively large in the discharge state, for example, due to the fluctuation of the discharged liquid, whereas the variation is small in the non-discharge state. Specifically, the index value obtained from the image obtained by imaging the non-discharge state is relatively small and has a small variation among the plurality of images. On the other hand, the index value obtained from the image obtained by imaging the non-discharge state is relatively large and also has a large variation among the plurality of images. From this, the value indicating the position or the sharpness of the single peak is used as the evaluation value and it is assumed that the image corresponds to the non-discharge state if the evaluation value is smaller than a predetermined threshold value, whereas the image corresponds to the discharge state if the evaluation value is larger than the threshold value.

When any of a plurality of known images corresponds to the non-discharge state, an index value obtained from an undetermined new image can be expected to be substantially included in a variation range of the index values obtained from the images collected in advance if the new image is obtained by imaging the non-discharge state. On the other hand, the index value is expected to be larger than the range of the index values obtained from the known images if the undetermined image is an image of the discharge state not included in the known images. Thus, a value corresponding to a substantially maximum value of the index values obtained from the collected images of the non-discharge state can be set as the reference value.

Contrary to the above, when the known images are images of the discharge state, an index value obtained from an undetermined image imaged in the discharge state is substantially included in its variation range, whereas an index value obtained from an undetermined image imaged in the non-discharge state is expected to be smaller than the variation range. Thus, a value corresponding to a substantially minimum value of the index values obtained from the known images of the discharge state may be set as the reference value.

Here, the term "substantially maximum value (or minimum value)" is used to mean that an exceptional value is excluded as an exception if the index values obtained from the respective plurality of known images include the exceptional value such as due to image noise or an irregular variation of a liquid discharge amount and a statistically significant "maximum value (or minimum value)" may be used as the reference value.

In this invention, reliable determination can be made in a short time by comparing the reference value obtained as described above and the index value obtained from the image to be determined and determining the discharge state or the non-discharge state based on that result.

Further, another aspect of this invention is directed to a discharge apparatus with a holder which holds a work, a nozzle which discharges liquid to the work and a discharge determiner which determines the presence or absence of the discharge of the liquid from the nozzle by the discharge determination method described above. In the thus configured invention, the state of the liquid discharged from the nozzle to the work can be determined as described above, wherefore whether or not the liquid is properly discharged can be determined.

In the invention, since a reference value corresponding to a mode of a histogram of index values obtained from a plurality of images is set in advance, a proper reference value can be obtained regardless of whether or not the liquid was discharged when those images were imaged. Since determination is made based on a magnitude relationship between this reference value and an index value of an undetermined image, whether or not the liquid is discharged from the nozzle can be reliably determined from an image in a short time.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIGS. 11A, 11B and 11C are graphs showing examples of an image content of the discharge determination region.

FIG. 14 is a flow chart showing the discharge determination processing.

DETAILED DESCRIPTION OF THE PREFERRED EMBODIMENTS

A substrate processing system comprising a substrate processing apparatus to which the invention is applicable will now be briefly described. In the following, a substrate may be any one of various types of substrates such as a semiconductor substrate, a glass substrate for photo mask, a glass substrate for liquid crystal display, a glass substrate for plasma display, a substrate for FED (Field Emission Display), an optical disk substrate, a magnetic disk substrate and a magneto-optic disk substrate. While the following will describe as an example a substrate processing system used primarily for processing of a semiconductor substrate with reference to drawings, the invention is applicable to processing apparatuses of various types of substrates mentioned above.

Figure 1:
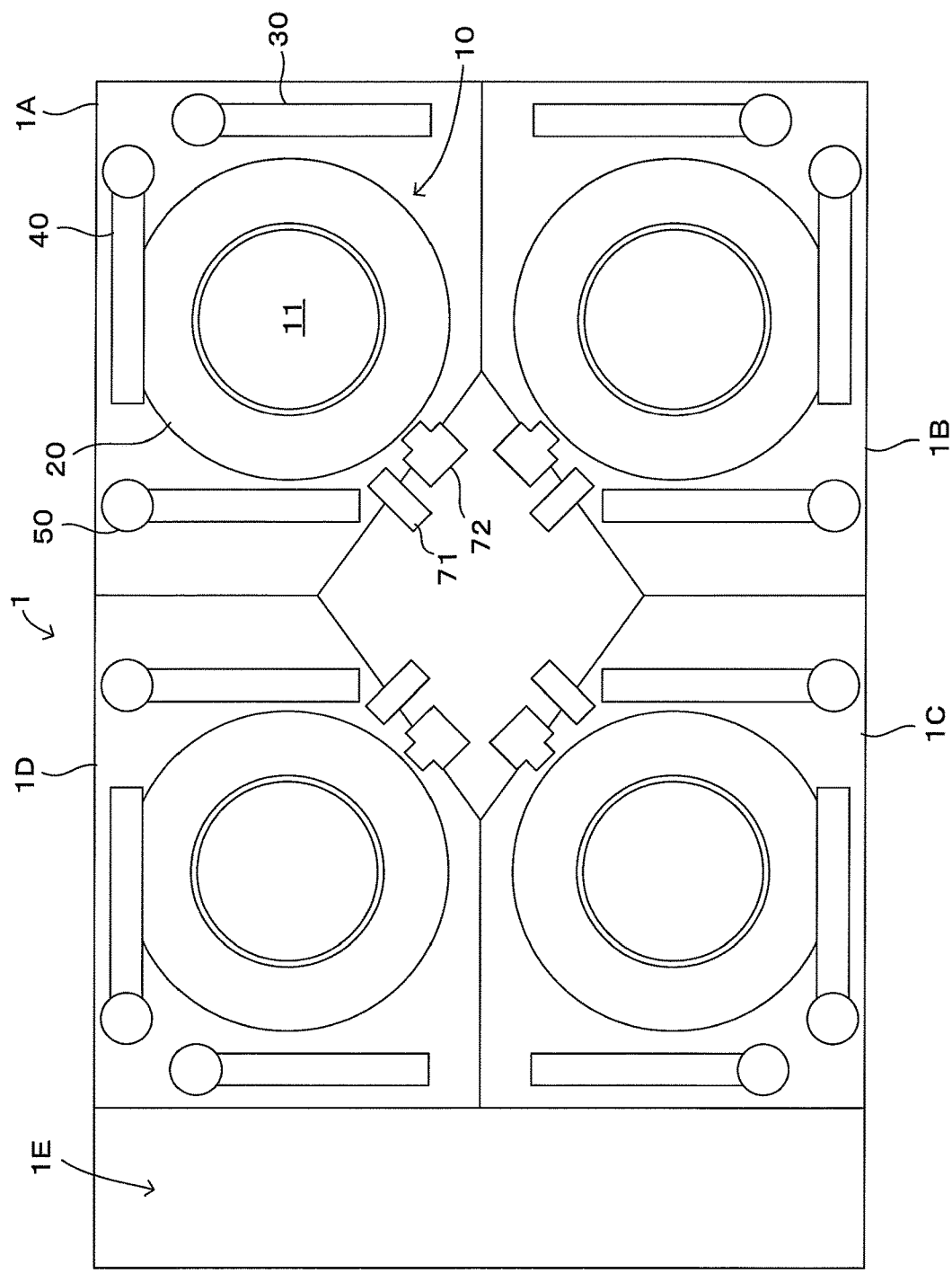
FIG. 1 is a schematic drawing showing the structure of a substrate processing system according to an embodiment of the invention.
Figure 3:
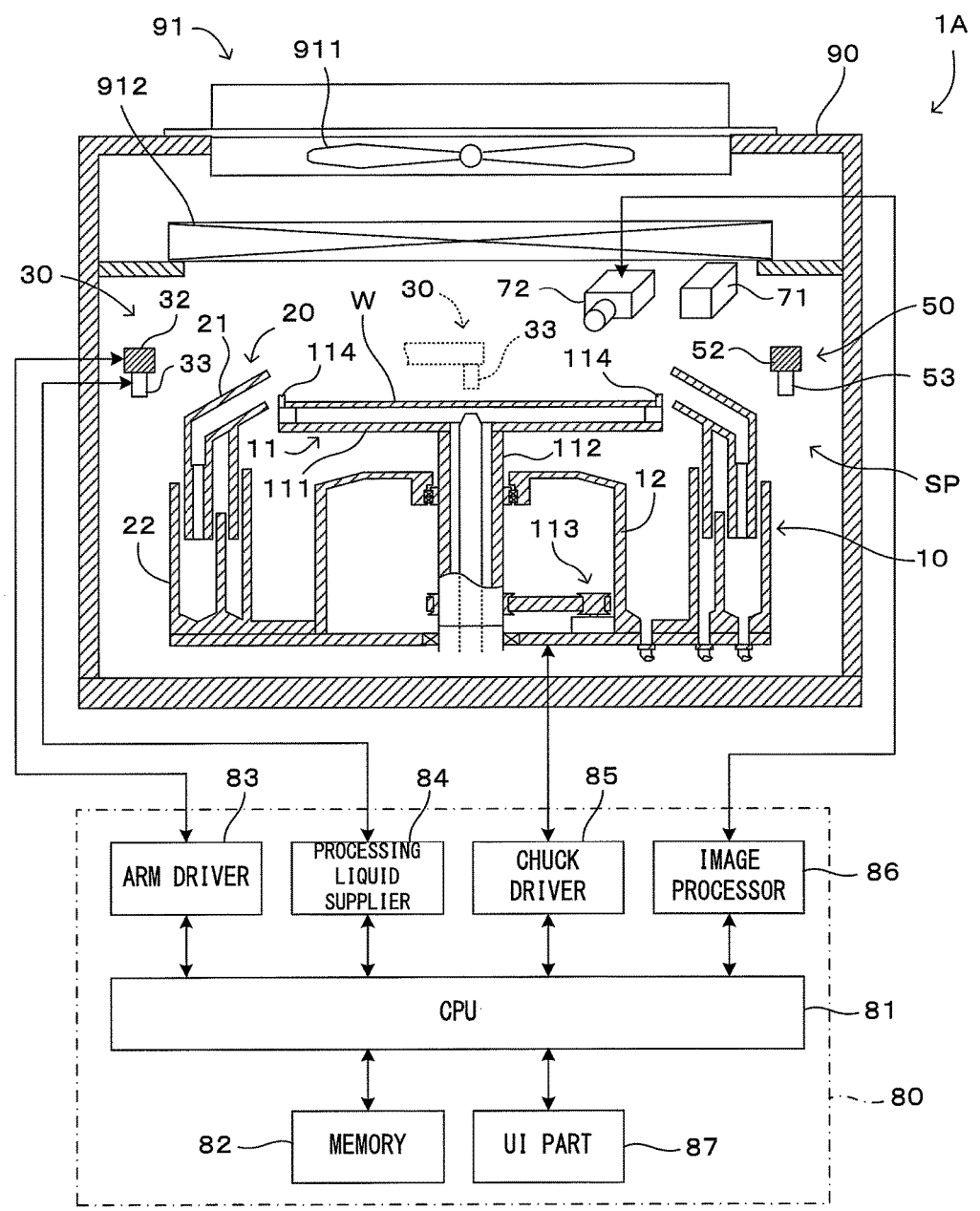
FIG. 3 is a drawing showing the cross section of FIG. 2 taken along the arrow A-A and shows the structure of the controller of the substrate processing unit.

FIG. 1 is a schematic drawing showing the structure of a substrate processing system according to an embodiment of the invention. To be more specific, FIG. 1 is a plan view which shows an embodiment of a substrate processing system comprising a discharge apparatus to which the invention is applied in a preferable fashion. The substrate processing system 1 comprises substrate processing units 1A, 1B, 1C and 1D, an indexer part 1E and a controller 80 (FIG. 3). The substrate processing units 1A, 1B, 1C and 1D are capable of executing predetermined processing of a substrate independently of each other. The indexer part 1E is equipped with an indexer robot (not shown) which is for transferring the substrate from the substrate processing units 1A, 1B, 1C and 1D to outside and vice versa. The controller 80 controls operations of the entire system. Any number of substrate processing units may be disposed, and more than one layers each housing four substrate processing units which are arranged horizontally may be stacked one atop the other.

The substrate processing units 1A, 1B, 1C and 1D are identical to each other with respect to structural elements and operations, although the layout of the structural elements is partially different depending upon the locations of these units within the substrate processing system 1. The following will describe the structure and operations of the substrate processing unit 1A but will omit describing the other substrate processing units 1B, 1C and 1D in detail.

Figure 2:
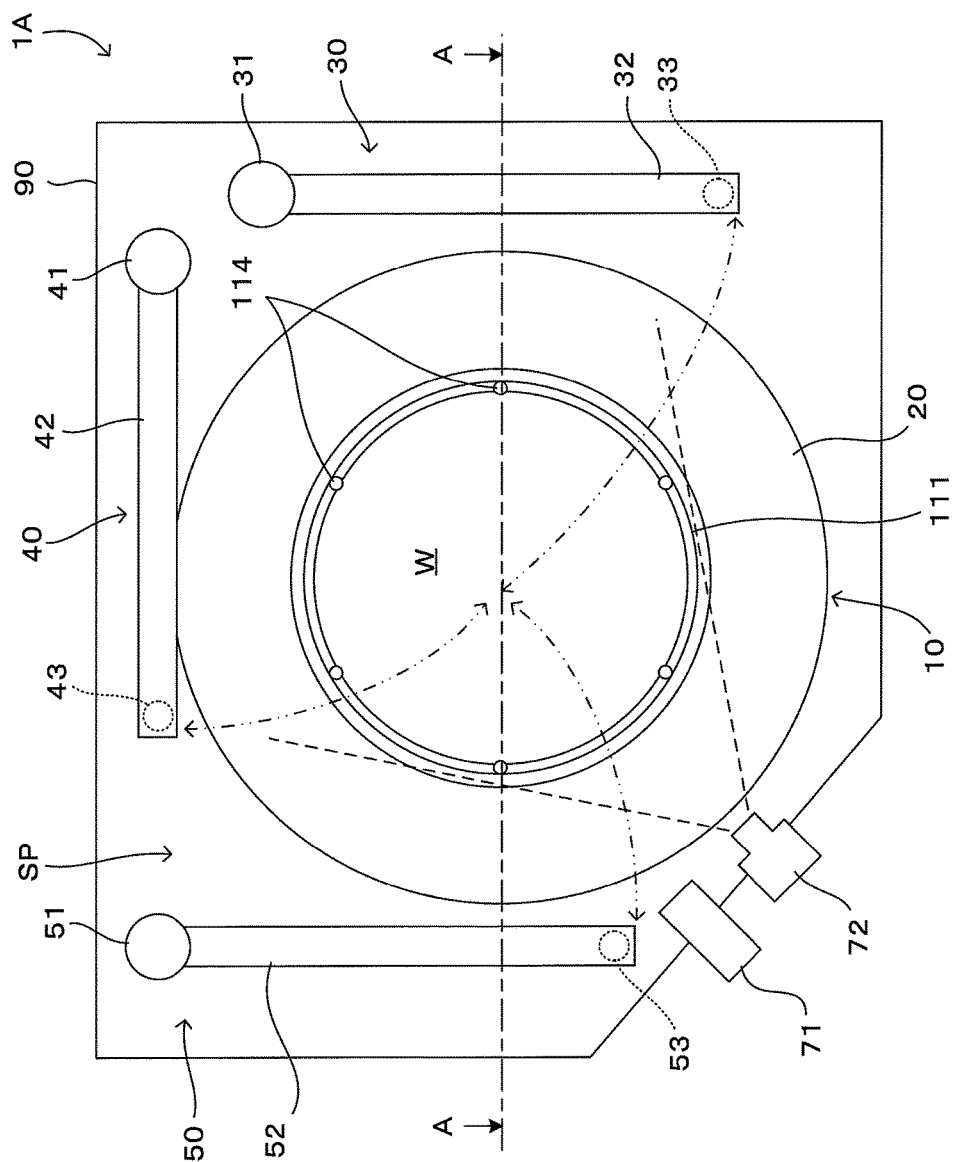
FIG. 2 is a plan view showing the structure of one substrate processing unit.

FIG. 2 is a plan view showing the structure of one substrate processing unit. FIG. 3 is a drawing showing the cross section of FIG. 2 taken along the arrow A-A and shows the structure of the controller of the substrate processing unit. The substrate processing unit 1A is a wet processing unit of the single wafer processing type for executing wet processing, such as cleaning and etching using a processing liquid, of a disk-shaped substrate W such as a semiconductor wafer. In the substrate processing unit 1A, a fan filter unit (FFU) 91 is disposed to a ceiling section of a chamber 90. The fan filter unit 91 comprises a fan 911 and a filter 912. External atmosphere which is admitted as the fan 911 operates is supplied into a processing space SP which is inside the chamber 90 via the filter 912. The substrate processing system 1 is used as it is installed inside a clean room, and the processing space SP continuously receives clean air all times.

A substrate holder 10 is disposed inside the processing space SP of the chamber 90. The substrate holder 10 is for rotating the substrate W while maintaining the substrate W in an approximate horizontal posture so that the one surface of the substrate W is directed toward above. The substrate holder 10 comprises a spin chuck 11 in which a disk-shaped spin base 111 whose outer diameter is slightly larger than the substrate W and a rotation support shaft 112 which elongates approximately along the vertical direction are integrated and linked with each other. The rotation support shaft 112 is linked with the rotation shaft of a chuck rotating mechanism 113 which includes a motor. Therefore, it is possible for the spin chuck 11 to rotate about the rotation shaft (the vertical axis) when driven by a chuck driver 85 of the controller 80. The rotation support shaft 112 and the chuck rotating mechanism 113 are housed inside a cylindrical casing 12. The spin base 111 is integrated and linked with the top end of the rotation support shaft 112 by a fastening component such as a screw, and the spin base 111 is supported by the rotation support shaft 112 approximately horizontally. Hence, as the chuck rotating mechanism 113 operates, the spin base 111 rotates about the vertical axis. The controller 80 controls the chuck rotating mechanism 113 via a chuck driver 85, which makes it possible to adjust the rotation speed of the spin base 111.

There are a plurality of chuck pins 114 for grabbing the substrate W at the peripheral edge which are disposed in the vicinity of the peripheral edge of the spin base 111. There may be three or more (six in this example) such chuck pins 114 for the purpose of securely holding the circular substrate W. The chuck pins are disposed at equal angular intervals along the peripheral edge of the spin base 111. Each chuck pin 114 is structured so as to be able to switch between the pressing state in which it presses the exterior peripheral edge surface of the substrate W and the released state in which it is off the exterior peripheral edge surface of the substrate W.

Each one of the chuck pins 114 is released when the substrate W is handed over to the spin base 111 but remains in the pressing state when the substrate W is rotated and subjected to predetermined processing. When in the pressing state, the chuck pins 114 can hold the substrate W at the peripheral edge of the substrate and keep the substrate W approximately horizontally over a predetermined gap from the spin base 111. Thus, the substrate W is supported with its top surface directed toward above and its bottom surface directed toward below. The chuck pins 114 may be of a known structure such as that disclosed in JP2013-206983A for instance. The mechanism for holding substrates is not limited to chuck pins but may instead be a vacuum chuck which sucks the substrate W at the back surface of the substrate and thereby holds the substrate.

Around the casing 12, a splash guard 20 is disposed which surrounds the substrate W which is held horizontally by the spin chuck 11 in such a manner that the splash guard 20 can move upward and downward along the rotation shaft of the spin chuck 11. The splash guard 20 has an approximately rotation symmetric shape with respect to the rotation shaft. The splash guard 20 comprises a plurality of guards 21 (two guards in this example), which are each disposed concentric to the spin chuck 11 and receive a splashed processing liquid from the substrate W, and a liquid receiver 22 which receives the processing liquid flowing down from the guards 21. As a guard up-down mechanism not shown disposed to the controller 80 makes the guards 21 ascend or descend stepwise, it is possible to segregate and collect a processing liquid such as a chemical solution and a rinse solution splashed around from the rotating substrate W.

Around the splash guard 20, at least one liquid supplier is disposed which provides the substrate W with various types of processing liquids such as a chemical solution which may be an etching solution, a rinse solution, a solvent, pure water and DIW (deionized water). In this example, as shown in FIG. 2, there are three liquid dischargers 30, 40 and 50. The liquid discharger 30 comprises a revolving shaft 31, which can revolve about the vertical axis when driven by an arm driver 83 of the controller 80, an arm 32 extending horizontally from the revolving shaft 31, and a nozzle 33 which is attached as it is directed toward below to the tip end of the arm 32. As the arm driver 83 drives the revolving shaft 31, the arm 32 swings about the vertical axis. By doing so, the nozzle 33 reciprocally moves between a retracted position which is outward beyond the splash guard 20 (i.e., the position denoted by the solid line in FIG. 3) and a position above the center of rotation of the substrate W (i.e., the position denoted by the dotted line in FIG. 3) as shown by the two-dot chain line in FIG. 2. The nozzle 33, while staying above the substrate W, discharges a predetermined processing liquid supplied from a processing liquid supplier 84 of the controller 80 and accordingly supplies the processing liquid to the substrate W.

Similarly, the processing liquid discharger 40 comprises a revolving shaft 41 which is driven by the arm driver 83, an arm 42 linked with this revolving shaft 41, and a nozzle 43 which is attached to the tip end of the arm 42 and discharges the processing liquid fed from the processing liquid supplier 84. The processing liquid discharger 50 comprises a revolving shaft 51 which is driven by the arm driver 83, an arm 52 linked with this revolving shaft 51, and a nozzle 53 which is attached to the tip end of the arm 52 and discharges the processing liquid fed from the processing liquid supplier 84. The number of the processing liquid dischargers is not limited to this but may be increased or decreased as needed.

In a condition that the substrate W is rotating at a predetermined rotation speed as the spin chuck 11 rotates, the processing liquid dischargers 30, 40 and 50 supply the processing liquid to the substrate W while the nozzles 33, 43 and 53 become positioned above the substrate W one after another, thereby performing wet processing of the substrate W. Different processing liquids or the same processing liquid may be discharged at the nozzles 33, 43 and 53 in accordance with the purpose of processing. Alternatively, two or more types of processing liquids may be discharged from one nozzle. The processing liquid supplied to the vicinity of the center of rotation of the substrate W spreads outwardly due to centrifugal force which develops as the substrate W rotates, and eventually gets drained off toward the side from the peripheral edge of the substrate W. The processing liquid thus splashed by the substrate W is then received by the guards 21 of the splash guard 20 and collected by the liquid receiver 22.

The substrate processing apparatus 1A further comprises an illuminator 71 which illuminates inside the processing space SP and a camera 72 which is neighboring of the illuminator 71 and takes an image of the surface of inside the processing space SP. The illuminator 71 and the camera 72 are arranged horizontally side by side in FIG. 2. Instead of this, these may be arranged vertically, that is, the illuminator 71 may be disposed at above or below the camera 72. The illuminator 71 uses an LED lamp as a light source for instance, and provides illumination light into inside the interior of the processing space SP which is needed for taking an image with the camera 72. The camera 72 is disposed at a higher position as compared with the substrate W along the vertical direction. Its imaging direction (i.e., the direction of the optical axis of the imaging optical system) is set as a downwardly oblique direction toward the approximate center of rotation in the surface of the substrate W so as to take an image of the top surface of the substrate W. The entire surface of the substrate W held by the spin chuck 11 thus comes into inside the field of view of the camera 72. In horizontally, an area between the two dashed lines in FIG. 2 is included in the field of view of the camera 72.

The imaging direction of the camera 72 and a direction of a light center of illumination light irradiated from the illuminator 71 substantially match. Thus, when the nozzle 33, 43, 53 and the processing liquid discharged therefrom are illuminated by the illuminator 71, the camera 72 images parts of the nozzle and the processing liquid on which the light from the illuminator 72 directly falls. This enables a high-luminance image to be obtained. At this time, the illuminator 71 and the camera 72 are provided at positions looking down the nozzle from a slightly upper side. Therefore, the occurrence of halation caused by incidence of regularly reflected light from the processing liquid into the camera 72 can be avoided. Note that since halation is not problematic for the purpose of merely determining the presence or absence of the flow-down of the processing liquid, the regularly reflected light from the processing liquid may be incident on the camera 72. Further, the illuminator 71 is arranged at any arbitrary position as long as contrast capable of discriminating the processing liquid against the background can be obtained.

The illuminator 71 and the camera 72 may be disposed inside the chamber 90. Instead of this, they may be disposed outside the chamber 90 so as to illuminate or take an image of the substrate W via a transparent window of the chamber 90. In view of avoiding adhesion of the processing liquid, it is preferable that the illuminator 71 and the camera 72 are disposed outside the chamber 90.

Image data output from the camera 72 are fed to an image processor 86 of the controller 80. The image processor 86 then performs predetermined image processing of the image data such as a correction processing or a pattern matching processing described later. As described later in detail, in this embodiment, in accordance with images taken by the camera 72, how the nozzles 33, 43 and 53 are positioned and how the substrate W is held is determined.

In addition to the above, the controller 80 of the substrate processing system 1 comprises a CPU 81, a memory 82 and a user interface (UI) part 87. The CPU 81 executes a processing program set in advance and accordingly controls operations of the respective parts. The memory 82 stores the processing program executed by the CPU 81, data created during processing, etc. The UI part 87 has an input function of accepting the instruction input from a user and an output function of informing the user about a progress in processing, an occurrence of abnormality or the like as needed. Each one of the substrate processing units 1A through 1D may have one such controller 80. Only one controller 80 may be disposed for the substrate processing system 1 for control of all substrate processing units 1A through 1D. Further, the CPU 81 may function as an image processor as well.

The operation of the substrate processing unit 1A having the structure above will now be described. The other substrate processing units 1B through 1D operate similarly although they will not be described. Through the indexer part 1E, the substrate processing unit 1A receives the substrate W which has been transported from outside and supplies various types of processing liquids while rotating the substrate W, thereby executing wet processing. A number of known techniques are available which use various types of processing liquids for wet processing, and any such technique may be used.

Figure 4:
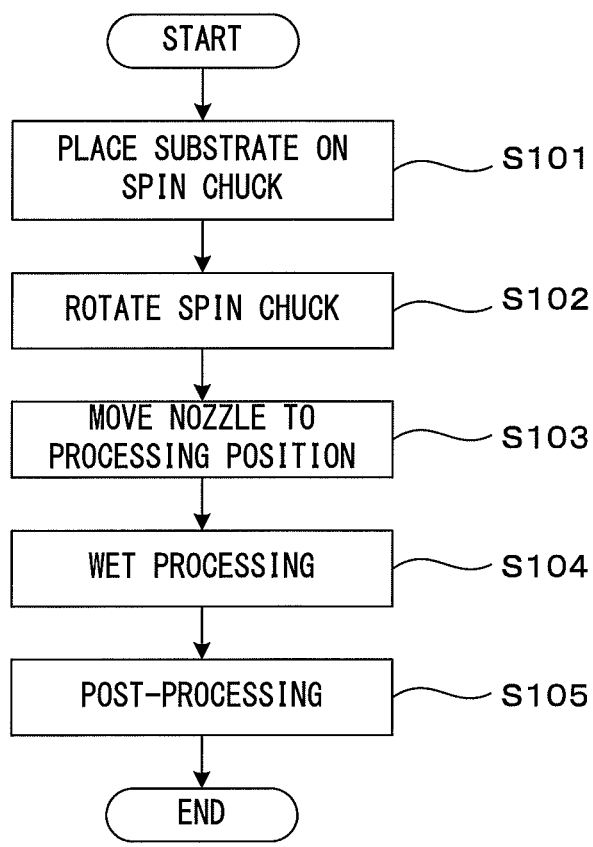
FIG. 4 is a flow chart outlining the operation of the substrate processing unit.

FIG. 4 is a flow chart outlining the operation of the substrate processing unit. When being carried into the substrate processing unit 1A, the substrate W is placed on the spin chuck 11, more specifically on the plurality of chuck pins 114 provided on the peripheral edge part of the spin base 111 (Step S101). When the substrate W is carried into, the chuck pins 114 provided on the spin base 111 are in the released state. After the substrate W is placed, the chuck pins 114 are switched to the pressing state and the substrate W is held by the chuck pins 114.

Subsequently, the spin chuck 11 is rotated at a predetermined rotation speed for substrate processing (Step S102). Then, the arm driver 83 is actuated to position any one of the plurality of nozzles at the predetermined processing position facing the substrate W (Step S103). Although the processing using the nozzle 43 is described below, the operation is similar also in the case of using the other nozzles 33, 53. Further, a plurality of nozzles may be simultaneously used for the processing.

When the nozzle 43 reaches the processing position, e.g. a position above the center of rotation of the substrate W, the wet processing is performed (Step S104). Specifically, the processing liquid is discharged from the nozzle 43 positioned at the processing position. After flowing down toward the upper surface of the substrate W rotating at the predetermined speed and landing on the vicinity of the center of rotation of the upper surface of the substrate W, the processing liquid spreads radially outwardly of the substrate W due to centrifugal force to cover the upper surface of the substrate W. In this way, the entire upper surface of the substrate W is processed by the processing liquid.

When the processing liquid is supplied for a predetermined time and the wet processing is finished, post-processing is performed (Step S105). Specifically, the nozzle 43 that has stopped discharging the processing liquid moves to the retracted position and the rotation of the spin chuck 11 is stopped. Note that the wet processing using another nozzle and processing of spinning off the processing liquid remaining on the substrate W may be performed as the post-processing with the rotation of the spin chuck 11 kept.

In the wet processing, it is necessary to properly position the nozzle at the processing position and supply the processing liquid to the substrate W at a proper timing to stably obtain a satisfactory processing result. To enable this, in the substrate processing unit 1A, the position of the nozzle and the flow-down state of the processing liquid discharged from the nozzle near the processing position are determined based on the image imaged by the camera 72. The principles of determination processings performed for this purpose and specific processing contents are successively described below.

Figure 5:
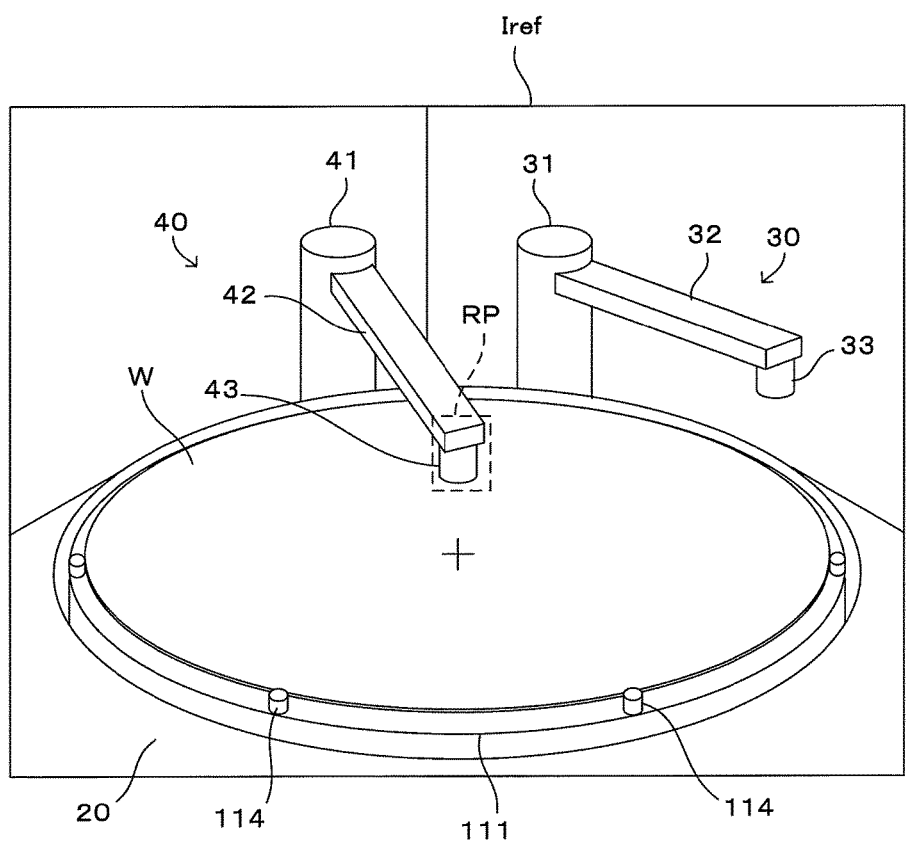
FIG. 5 is a drawing showing the principle of nozzle position determination processing.

FIG. 5 is a drawing showing the principle of nozzle position determination processing. More specifically, FIG. 5 shows an example of a reference image Iref imaged with the nozzle 43 positioned at the proper processing position, e.g. at such a position that a center of an opening of the nozzle 43 is located right above the center of rotation of the substrate W. An image of the nozzle 43 at this time is segmented as a reference pattern RP and the coordinate position thereof is stored.

When the processing on the substrate W is performed, a positioning control of the nozzle 43 is executed using the position of the nozzle 43 in the reference image Iref as a target position. When the positioning of the nozzle 43 is completed, a region of an image at that time substantially matching the reference pattern RP is searched by pattern matching processing, whereby the position of the nozzle 43 is detected. The position of the nozzle 43 at this time is compared with the position of the nozzle 43 in the reference image Iref. If a position deviation amount between the images is not larger than a threshold value determined in advance, the position of the nozzle 43 is determined to be proper. On the other hand, if the deviation amount is larger than the threshold value, the nozzle position is determined to be abnormal.

Figure 6:
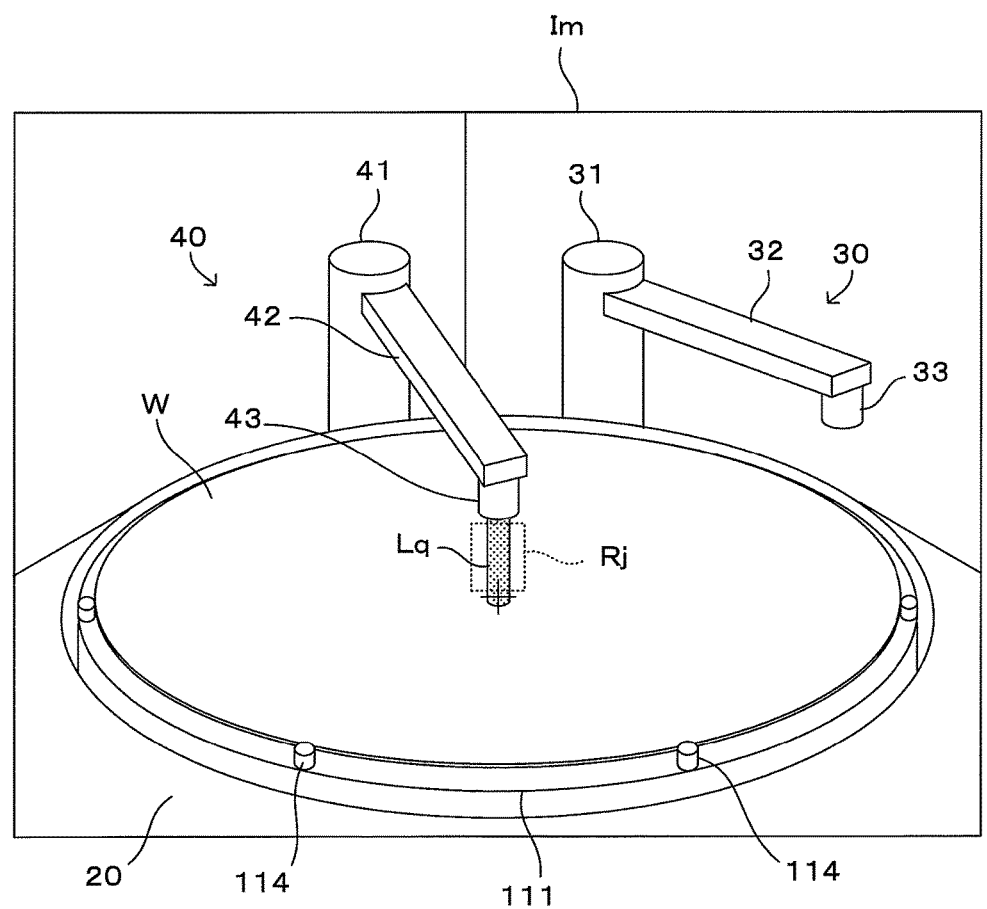
FIG. 6 is a drawing showing the principle of discharge determination processing.

FIG. 6 is a drawing showing the principle of discharge determination processing. More specifically, FIG. 6 shows an example of an image Im imaged when the processing liquid is being continuously discharged from the nozzle 43 positioned at the processing position. A partial region of the image Im including a position right below the nozzle 43, more specifically a position serving as a flow-down path for the processing liquid Lq discharged from the nozzle 43 and flowing down toward the upper surface of the substrate W is set as a discharge determination region Rj. As described later, whether or not the processing liquid Lq is being discharged from the nozzle 43 is determined based on the image content of this discharge determination region Rj.

Note that although the reference pattern RP and the discharge determination region Rj have rectangular shapes here, there is no limitation to this. If these have rectangular shapes, the positions thereof can be simply expressed such as by the positions of two vertices on a diagonal or by a combination of an origin position and lengths of sides.

Figure 7:
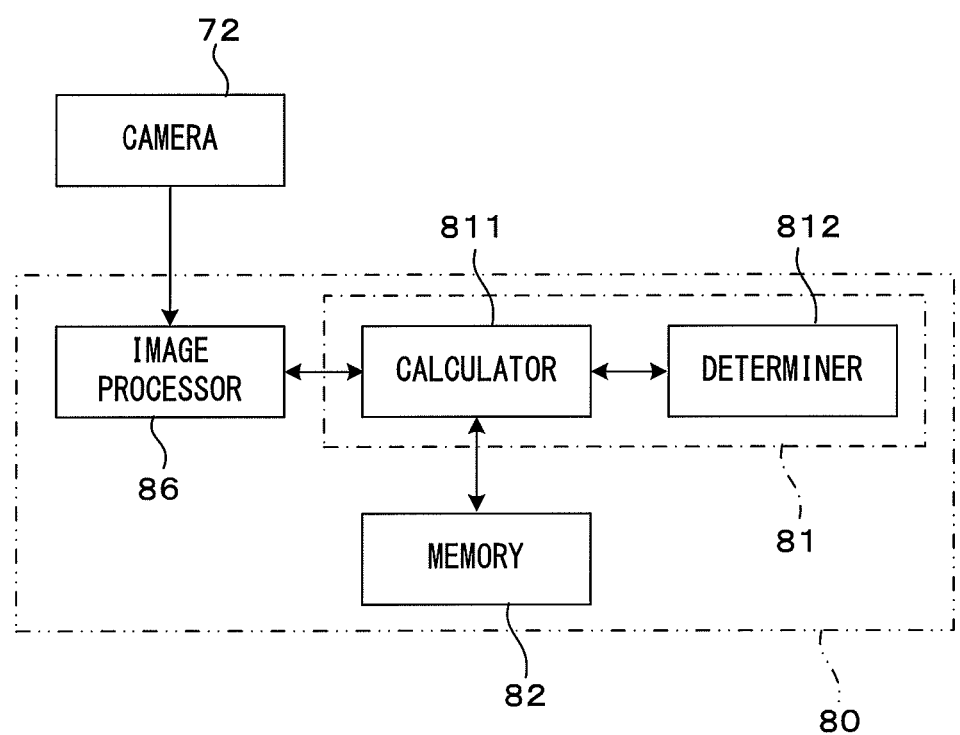
FIG. 7 is a block diagram showing functional blocks necessary to perform the determination processings.

FIG. 7 is a block diagram showing functional blocks necessary to perform the determination processings. An image processor 86 performs appropriate image processing such as noise removal processing and image analysis by pattern matching for the image imaged by the camera 72. Based on a processing result, a calculator 811 performs predetermined arithmetic processing and a determiner 812 executes a determination. Each functional block such as the calculator 811 and the determiner 812 is realized by the CPU 81 executing a predetermined control program and cooperating with the image processor 86, the memory 82 and the like.

Figure 8:
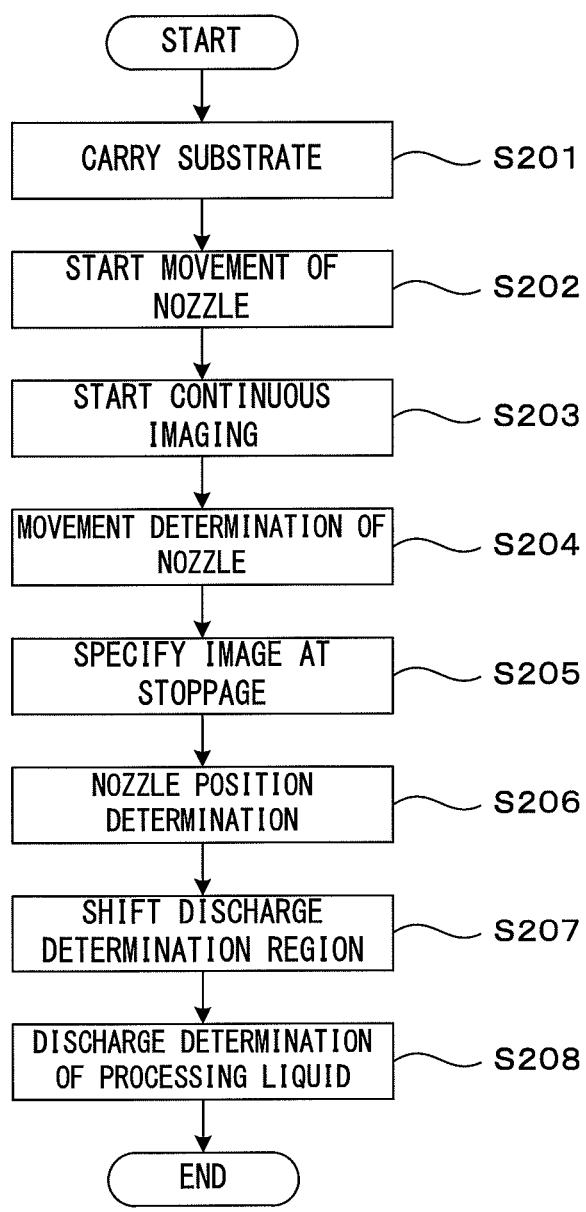
FIG. 8 is a flow chart showing the determination processings of the substrate processing unit.
Figure 9:
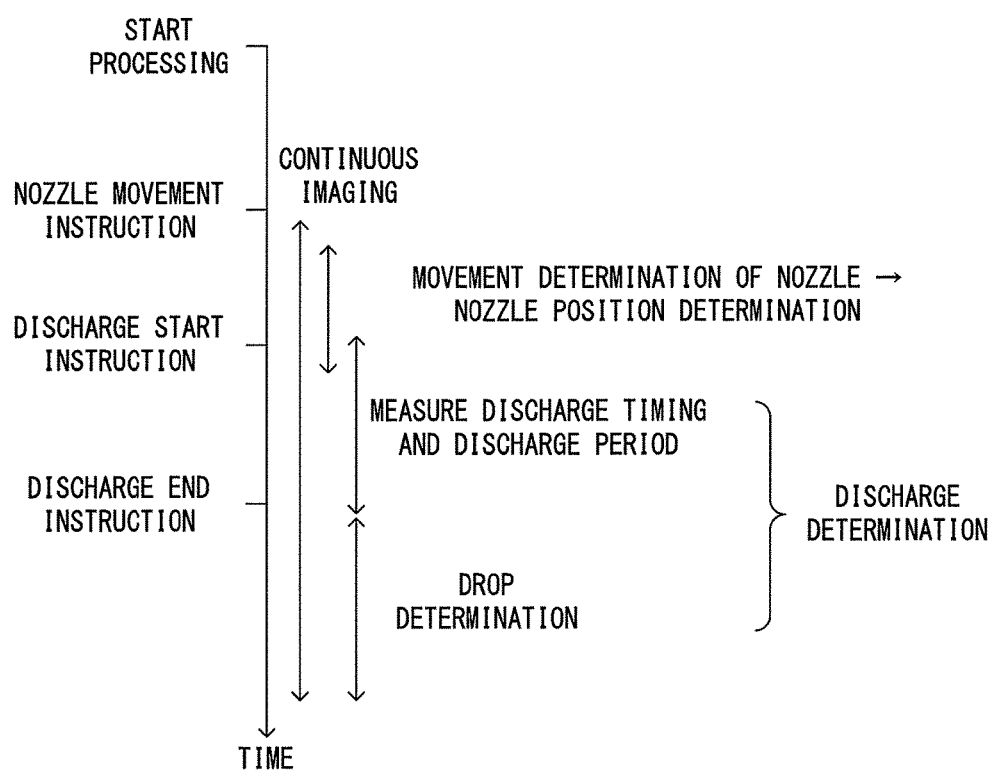
FIG. 9 is a chart showing an execution timing of each processing.

FIG. 8 is a flow chart showing the determination processings of the substrate processing unit. Further, FIG. 9 is a chart showing an execution timing of each processing. The substrate W is carried into the substrate processing unit 1A, the processing is started (Step S201) and the movement of the nozzle 43 is started (Step S202). More specifically, a nozzle movement instruction, i.e. a control command to the effect of moving the nozzle 43 from the retracted position to the processing position is given from the CPU 81 to the arm driver 83. In this way, the arm driver 83 rotates the revolving shaft 41 and the nozzle 43 moves toward the processing position.

At this time, continuous imaging by the camera 72 is started (Step S203). The camera 72 successively obtains images at a fixed time interval by regularly performing imaging at a fixed frame rate (e.g. 100 fps). The imaging by the camera 72 needs to be started before the nozzle 43 reaches the processing position. For example, the imaging may be started when an instruction to the effect of moving the nozzle is given from the CPU 81 to the arm driver 83 as shown in FIG. 9.

When the imaging by the camera 72 is started, a movement determination of the nozzle 43 is executed (Step S204). The nozzle movement determination is processing for determining whether the nozzle 43 is moving or stopped. The content of the imaged image changes frame by frame while the nozzle 43 is moving. If the nozzle 43 is stopped, there is no more change between the images. For example, the calculator 811 can calculate a difference of the images between the frames adjacent with respect to imaging time. The determiner 812 can determine whether or not the nozzle 43 has been stopped, based on whether or not that difference is not larger than a fixed value. The calculation of the difference can be realized, for example, by integrating an absolute value of a difference of luminance values of pixels located at the same position in two images for all pixels. Note that a determination may be executed using images of three or more successive frames to avoid an erroneous determination due to noise or the like.

When the stop of the nozzle 43 is determined, one image imaged at a time at which the nozzle 43 seems to have stopped is specified out of a plurality of successively imaged images (Step S205). Specifically, for example, when a difference of images of two successive frames becomes equal to or smaller than the fixed value and the nozzle 43 is determined to have stopped, the image imaged earlier out of those images can be set as an image at stoppage.

A nozzle position determination is executed based on the image at stoppage (Step S206). The nozzle position determination is processing for determining whether or not the nozzle 43 is correctly positioned at the processing position determined in advance. Whether or not the nozzle position is proper can be determined by the comparison of the image at stoppage and the reference image Iref imaged with the nozzle 43 positioned at the proper position in preparatory processing performed prior to the processings on the substrate W.

Figure 10:
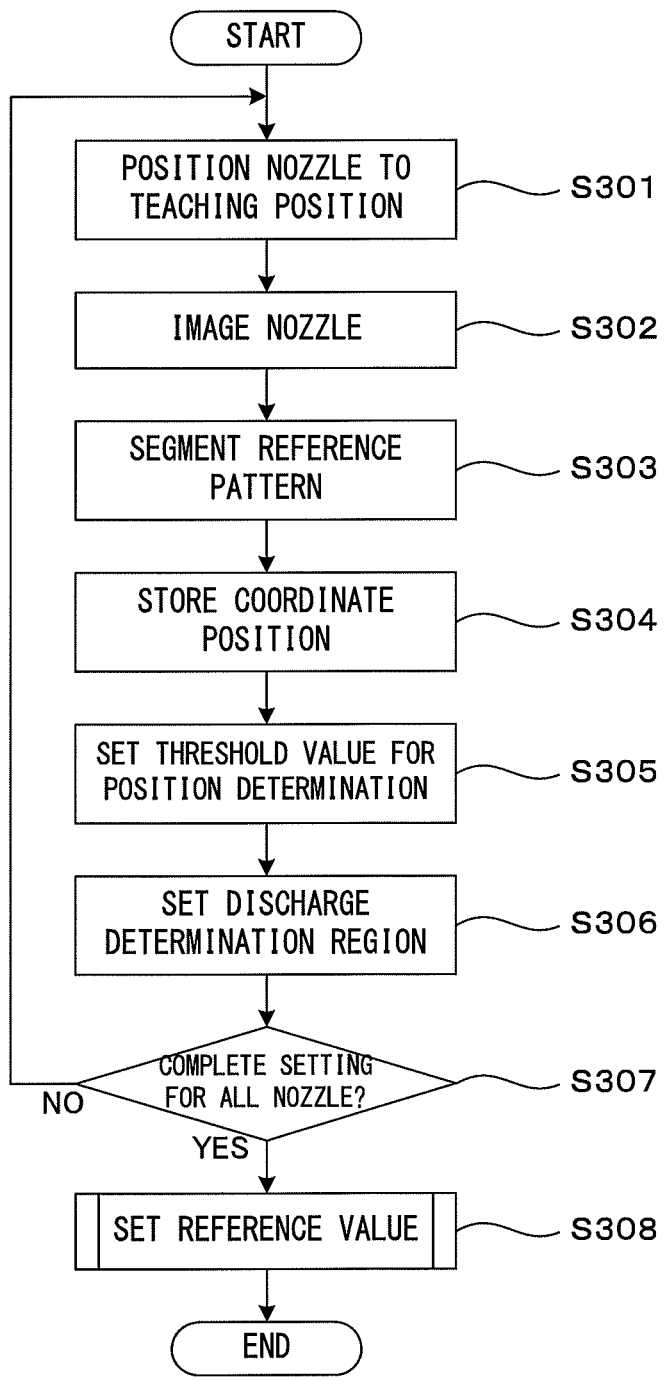
FIG. 10 is a flow chart showing the processing content of the preparatory processing.

FIG. 10 is a flow chart showing the processing content of the preparatory processing. In the preparatory processing, the position of the nozzle 43 during the substrate processing, i.e. the processing position is taught by an operator (teaching operation). The controller 80 stores the position of the nozzle 43 at that time as the proper processing position. Using this processing position as a target position during the execution of the substrate processing, the positioning control of the nozzle 43 is executed.

Specifically, the nozzle 43 is positioned at the proper processing position, e.g. the position where the center of the opening of the nozzle 43 is right above the center of rotation of the substrate W by the operation of the operator (Step S301). In this description, the position of the nozzle 43 at this time designated by the operator is called a "teaching position". Then, the camera 72 images an image including an image of the nozzle 43 in an imaging field of view (Step S302). The image at this time may be a still image of one frame. This image is used as the reference image Iref (FIG. 5) representing the proper position of the nozzle 43.

Subsequently, a partial region corresponding to the image of the nozzle 43 is segmented as the reference pattern RP from the reference image Iref (Step S303). This segmentation can be executed by extracting a rectangular region including the image of the nozzle 43 in the reference image Iref designated by the operator through an operation input to be received by the UI part 87. Further, for example, the reference pattern RP can be segmented also by the image processor 86 performing pattern matching processing and searching a region matching the image of the nozzle 43 prepared in advance in the reference image Iref. The segmented reference pattern RP is stored in the memory 82 together with the coordinate position therein in the image (Step S304).

Subsequently, a threshold value for position determination set by the operator is received by the UI part 87 (Step S305) and stored in the memory 82. The threshold value for position determination specifies a maximum deviation amount allowed between the position of the nozzle 43 in the image at stoppage and the position of the reference pattern RP in the reference image Iref. Even if the positions of the both do not perfectly match, the nozzle 43 is regarded to be positioned at the proper position if the deviation amount is not larger than the threshold value. On the other hand, if the deviation is larger than the threshold value, the nozzle position is determined to be abnormal. The determination is stricter as the threshold value becomes smaller. A numerical value of the threshold value can be appropriately set by the operator according to the purpose of the processing.

Subsequently, the discharge determination region Rj is set (Steps S306). As described in detail later, in the discharge determination processing, whether or not the processing liquid Lq is being discharged from the nozzle 43 is determined based on an evaluation value calculated from a pixel value (a luminance value) of each pixel constituting the discharge determination region Rj. To this end, the discharge determination region Rj is set to include a region which is estimated that at least a part of the flow-down path of the processing liquid Lq is included out of the reference image Iref in which the nozzle 43 is positioned at the proper position. The discharge determination region Rj may be set by setting inputs from an operator via the UI part 87. These setting inputs are stored in the memory 82.

By successively performing Steps S301 to S306 described above for all the nozzles (Step S307), the preparatory processing is completed. In this way, the reference pattern RP, the threshold value for position determination, the discharge determination region Rj for discharge determination are respectively set for each of the nozzles 33, 43 and 53. Subsequently, a reference value for discharge determination is set (Step S308). The discharge determination processing is performed based on a magnitude relationship between an index value obtained from the pixel values of the pixels in the discharge determination region set as described above and the reference value determined in advance. The principle of the discharge determination processing and how to set the reference value used at that time are described in detail later.

Referring back to FIG. 8, the description of the determination processings is continued. The nozzle position determination (Step S206) is executed based on the reference pattern RP and the threshold value for position determination set in the preparatory processing, thereby whether or not the nozzle 43 is properly positioned at the processing position is determined. Specifically, the position deviation amount of the nozzle 43 in comparison to the reference image Iref is calculated by the calculator 811. If the deviation amount is not larger than the threshold value, the determiner 812 determines that the nozzle 43 is at the proper position. In this case, the processing on the substrate W is continued.

On the other hand, if the position deviation amount is determined to be larger than the threshold value, a message to the effect that the position of the nozzle 43 is abnormal is notified to the operator via the UI part 87. In this case, the processing may be stopped as processing error or the processing may be continued after an error is recorded. Further, it may also be possible to let the operator instruct whether to continue or stop the processing.

In the case of continuing the processing, if there is any deviation between the position of the nozzle 43 and the original processing position, the discharge determination region Rj is shifted according to that deviation amount (Step S207). In this way, even if the position of the nozzle 43 is slightly deviated, the discharge determination region Rj can be properly set on the flow-down path of the processing liquid Lq. In this state, the discharge determination of the processing liquid is executed.

The discharge determination is processing for determining whether or not the processing liquid Lq is flowing down from the nozzle 43 toward the upper surface of the substrate W. More specifically, the discharge determination includes processing for measuring a discharge timing and a discharge period and liquid drop determination processing as shown in FIG. 9. As described below, a processing algorithm of the discharge determination is for determining whether or not the flow-down of the processing liquid Lq is observed in the discharge determination region Rj in the imaged image of one frame. Using this determination result, the processing for measuring the discharge timing and the discharge period and the liquid drop determination processing can be performed.

Specifically, by executing the discharge determination for each of images of a plurality of frames successively imaged, the discharge timing of the processing liquid Lq from the nozzle 43, i.e. times at which the discharge is started and stopped can be calculated. From these, the discharge period in which the discharge is continued can be calculated. Further, by detecting the flow-down of the processing liquid occurring at a timing at which the discharge is not supposed to be performed, the presence or absence of, for example, a "liquid drop" phenomenon in which the processing liquid Lq remaining in the nozzle 43 irregularly drops onto the substrate W can be determined.

The discharge determination needs to be started at the latest before the discharge is started. Thus, the discharge determination can be started, for example, when an instruction to the effect that the discharge of the processing liquid should be started is given from the CPU 81 to the processing liquid supplier 84. There is a slight time delay until the processing liquid Lq is actually discharged from the nozzle 43 after the instruction to start the discharge is given. Further, to detect a discharge end timing, the discharge determination needs to be continued for a while after an instruction to the effect that the discharge of the processing liquid should be finished is given from the CPU 81 to the processing liquid supplier 84. Further, the liquid drop determination for detecting the liquid drop phenomenon can be executed by consecutively executing the discharge determination also after the end of the discharge is detected.

Next, the processing content of the discharge determination is described. As described above, the discharge determination processing in this embodiment is processing for determining based on the image (still image) of one frame whether or not the processing liquid Lq is flowing down from the nozzle 43. Specifically, this processing does not require a reference image or an image of another frame as a comparison object. The more detailed principle and specific processing content of the discharge determination processing are successively described below.

FIGS. 11A, 11B and 11C are graphs showing examples of an image content of the discharge determination region. An X direction and a Y direction in the following images are defined as follows. A two-dimensional image is expressed by arranging a number of very small pixels in a matrix in two orthogonal directions. In such a two-dimensional image, one arrangement direction is called the X direction and another arrangement direction orthogonal to the former one is called the Y direction. Here, a lateral direction is the X direction and a longitudinal direction is the Y direction with a left-upper corner of the image as an origin. As described later, it is preferable that either the X direction or the Y direction substantially matches a vertical direction in an actual imaging object. In this embodiment, the camera 72 is disposed such that the Y direction matches the vertical direction.

As can be understood from the comparison of the reference image Iref of FIG. 5 and the image Im of FIG. 6, the upper surface of the substrate W behind the flow-down path is seen at the position right below the nozzle 43 when the processing liquid is not being discharged from the nozzle 43. On the other hand, when the processing liquid is being discharged from the nozzle 43, the flow-down path is taken up by the liquid Lq at the position right below the nozzle 43 and the substrate W is masked with the liquid Lq. Thus, an image appearing in the discharge determination region Rj at an arbitrary imaging timing is either the processing liquid Lq or the upper surface of the substrate W. In other words, the arranged position of the camera 72 is desirably set to obtain such an imaging field of view. Note that the background is not limited to the substrate W. For example, an appropriate member in the processing space SP not having a remarkable texture such as an inner wall of the chamber 90 can be used.

When the processing liquid is not flowing down, only the upper surface of the substrate W appears in the discharge determination region Rj and there is no notable luminance change in the region as shown in a left figure of FIG. 11A. A right figure of FIG. 11A shows an example of a luminance distribution on a straight line L traversing the discharge determination region Rj in the X direction. As shown in this figure, the luminance distribution is relatively uniform although there is a luminance variation due to irregular reflection caused by a pattern formed on the substrate W and the reflection of components in the chamber 90.

On the other hand, if the processing liquid Lq is being continuously discharged from the nozzle 43, an image of the processing liquid Lq flowing down in a column-like manner appears in the discharge determination region Rj as shown in a left view of FIG. 11B. If illumination light is incident substantially in the same direction as the imaging direction of the camera 72, the surface of the liquid column by the processing liquid Lq looks luminous. Specifically, as shown in a right figure of FIG. 11B, a part corresponding to the liquid column has a higher luminance than a surrounding part.

If an illumination direction is different or if the processing liquid Lq has a dark color, the liquid column part may have a lower luminance than the surrounding as shown in FIG. 11C. Even in this case, a luminance distribution clearly different from that of the surrounding part is seen in a part corresponding to the liquid column. However, general processing liquid used for substrate processing is close to transparent or white and has a higher luminance than the surrounding as shown in FIG. 11B in many cases.

If the luminance characteristically appearing when the processing liquid Lq is present in the discharge determination region Rj is detected in this way, the presence or absence of the processing liquid can be determined. In the discharge determination of this embodiment, a luminance change in the discharge determination region Rj is detected by the following data processing to reliably determine the presence or absence of the flow-down of the processing liquid from the image of one frame without comparison with another image.

Figure 12A:
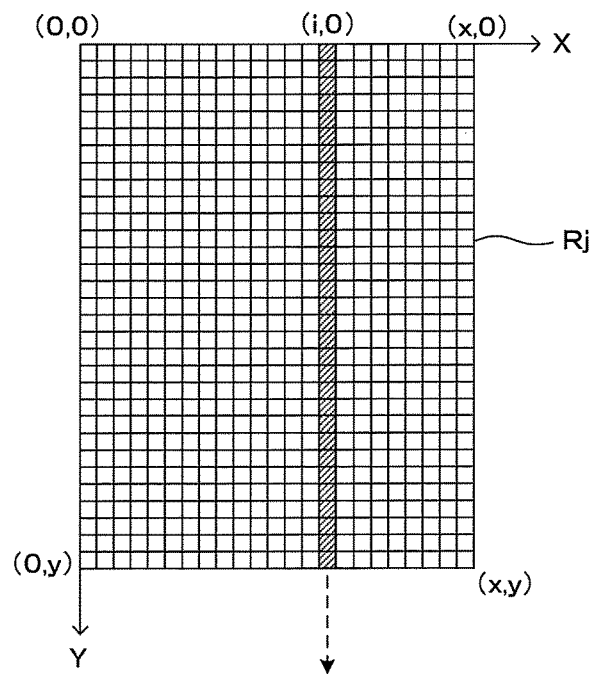
FIGS. 12A and 12B are graphs showing the data processing in the discharge determination processing.
Figure 12B:
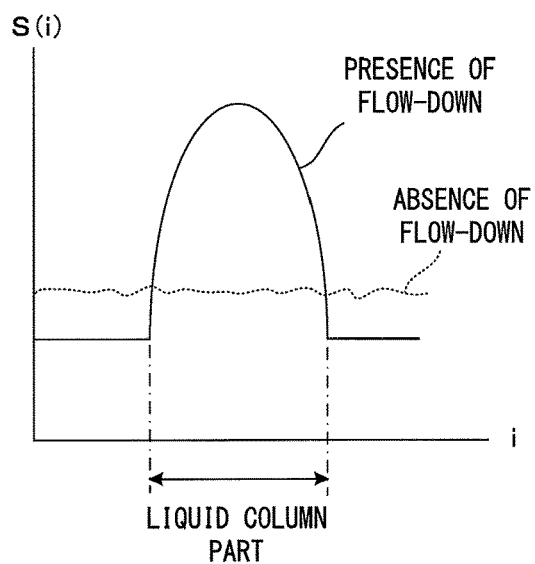

FIGS. 12A and 12B are graphs showing the data processing in the discharge determination processing. As shown in FIG. 12A, a pixel on the left-upper corner and a pixel on the right-lower corner of the discharge determination region Rj are represented by coordinates (0, 0) and (x, y). The discharge determination region Rj is composed of (x+1) pixels in the X direction and (y+1) pixels in the Y direction and the Y direction matches the vertical direction during imaging. A pixel column composed of a plurality of pixels having a common X-coordinate value and arranged in a line along the Y direction out of the pixels constituting the discharge determination region Rj is thought and luminance values of the respective pixels belonging to this pixel column are totaled. This is equivalent to the summation of the luminance values of all the pixels (pixels hatched in FIG. 12A) having an X-coordinate value of i (0≤i≤x) in the Y direction. This total value is called a "luminance summation value" below. If the luminance value of the pixel at coordinates (i, j) is Pij, the luminance summation value S(i) in the pixel column having the X-coordinate value of i is expressed by the following equation (Equation 1).

$$S(i) = \sum_{j=0}^{y} Pij \quad \text{(Equation 1)}$$

Here, the Y direction matches the vertical direction, i.e. the direction in which the processing liquid Lq discharged from the nozzle 43 flows down toward the substrate W. Accordingly, when the processing liquid Lq is continuously discharged from the nozzle 43 and flows down in a column-like manner, a liquid column extending along the Y direction, i.e. the direction of the pixel column appears in the discharge determination region Rj. Thus, if this pixel column is located at a position corresponding to the interior of the liquid column, many pixels have a luminance value specific to the processing liquid Lq. On the other hand, if this pixel column is located at a position corresponding to a background part around the liquid column, the pixels have a luminance value of the substrate W in the background.

Thus, in the luminance summation value S(i) integrated in the Y direction for each pixel column, the luminance value specific to the processing liquid Lq is more emphasized if this pixel column is located at the position corresponding to the interior of the liquid column. In contrast, if this pixel column is located at the position corresponding to the background part, a change in shading along the Y direction is canceled out and the luminance summation value S(i) is a value approximate to the integration of average luminance values of the substrate W.

As shown in FIG. 12B, if a profile plotting the luminance summation value S(i) in relation to the value i, i.e. the X-direction position of the pixel column is thought, a difference of luminance profiles shown in the right figures of FIGS. 11A and 11B is more emphasized. Specifically, when the liquid column is present in the discharge determination region Rj, the luminance values of a part of the luminance profile shown in the right figure of FIG. 11B corresponding to the liquid column are more emphasized and appear as a large peak (dip if the processing liquid has a dark color) to clarify the difference from the background part as schematically shown by solid line in FIG. 12B. On the other hand, if the liquid column is not present in the discharge determination region Rj, no significant peak appears as shown by dotted line in FIG. 12B.

Accordingly, if a change mode in the X direction of the luminance summation value S(i) in the Y direction is checked in one image, the presence or absence of the flow-down of the processing liquid Lq in the discharge determination region Rj can be determined even without comparison with another image. By using the luminance summation value S(i) in the pixel column along the flow-down direction of the processing liquid Lq, a luminance change associated with the flow-down of the liquid can be more accurately detected even if the luminance change is small, which can lead to a more reliable determination.

The discharge determination region Rj needs to include a region where the luminance changes depending on the presence or absence of the processing liquid Lq, but needs not necessarily include the entire flow-down path of the processing liquid Lq. It is preferable that the liquid column by the processing liquid Lq reaches from the upper end to the lower end of the discharge determination region Rj in the Y direction as shown in FIG. 11B. In this sense, only a part of the flow-down path may be included. Further, it is preferable to include, more or less, the background part around the liquid column in the X direction. By doing so, the luminance of the liquid column part can be more effectively emphasized in comparison to the background part.

Note that, in illumination from a direction substantially matching the imaging direction, a central part of the liquid column has a particularly high luminance in the X-direction and a peripheral edge part has a luminance lower than this. Specifically, a characteristic luminance profile appears in the X-direction in the region of the discharge determination region Rj corresponding to a central part of the liquid column. Thus, the background part is not always necessary in the case of utilizing this characteristic luminance for detection. The same holds also when there is a clear difference in luminance value between the liquid column part and the background part as described later.

Note that an image of a droplet appears in a part of the flow-down path in the discharge determination region Rj if the processing liquid Lq flows down not continuously, but in droplets, for example, in the liquid drop phenomenon. Even in this case, an image of a droplet has a certain spread in the Y-direction along the flow-down direction. Thus, by totaling the luminance values in the Y-direction and emphasizing the luminance values specific to the processing liquid, it is possible to reliably grasp a difference in the luminance summation value between when the droplet is included in the pixel column and when no droplet is included, regardless of the position of the droplet. However, the magnitude of a peak appearing in the profile of the luminance summation value is expected to be smaller than in the case of the liquid column.

In a specific determination process, an appropriate evaluation value quantitatively indicating the change mode in the profile of the luminance summation value S(i) in relation to the X-direction coordinate value i, is for example, introduced and the presence or absence of the processing liquid is determined depending on a magnitude relation between the evaluation value and a threshold value determined in advance. If the processing liquid has a higher luminance than the background in the image, the following measure can be, for example, adopted.

Figure 13A:
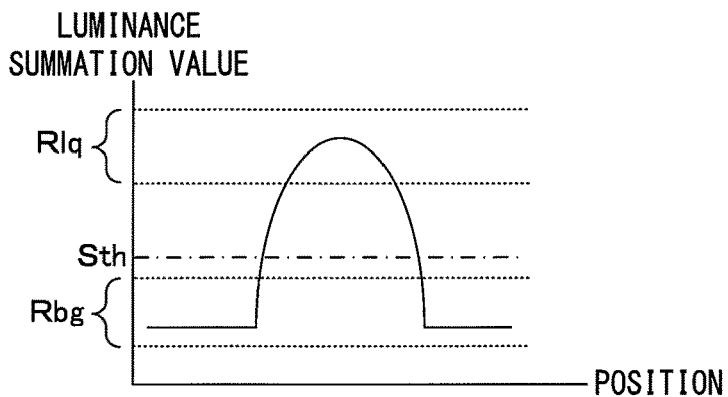
FIGS. 13A, 13B and 13C are graphs illustrating a relationship between the evaluation value and the threshold value.
Figure 13B:
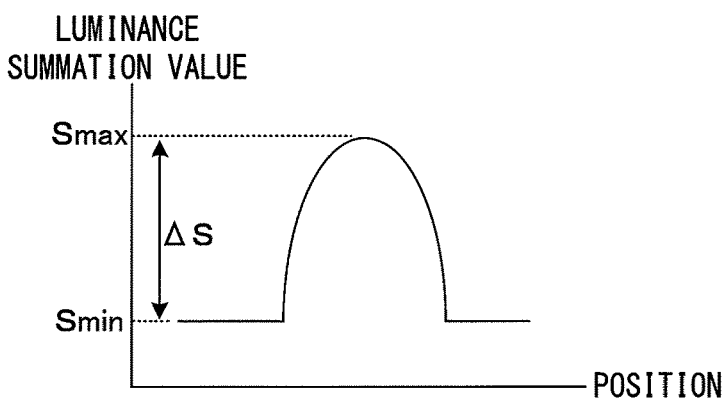
Figure 13C:
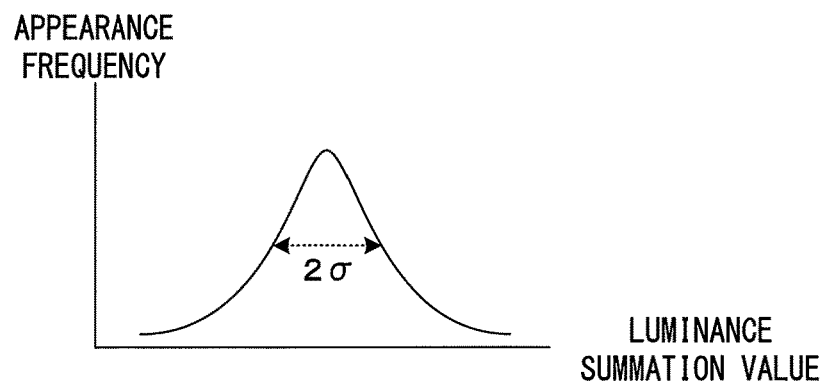

FIGS. 13A, 13B and 13C are graphs illustrating a relationship between the evaluation value and the threshold value. When a range Rlq of the luminance summation value of the processing liquid Lq and a range Rbg of the luminance value of the background part are known beforehand and these are clearly separable as shown in FIG. 13A, the luminance summation value S(i) itself can be used as the evaluation value. Specifically, a value slightly closer to a high luminance side than the range Rbg of the luminance summation value from the background may be set as a threshold value Sth. The threshold value Sth may be set at any value between the luminance summation value range Rlq of the processing liquid Lq and the luminance summation value range Rbg of the background part. However, to detect also droplets, which are not continuous, as described above, the presence of the flow-down of the processing liquid is preferably determined if the luminance summation value S(i) is larger than the luminance summation value range Rbg of the background. Thus, the threshold value Sth is set at a value close to an upper limit of the luminance summation value range Rbg of the background.

Further, as shown in FIG. 13B, a difference ΔS between a maximum value Smax and a minimum value Smin in the profile of the luminance summation value S(i) may be used as the evaluation value. If a notable peak associated with the flow-down of the processing liquid is present, this difference ΔS is a large value. On the other hand, in the absence of the flow-down of the processing liquid, this difference ΔS is a very small value. From this, the difference ΔS between the maximum value Smax and the minimum value Smin of the luminance summation value S(i) may be used as the evaluation value and a threshold value may be set for this.

Further, if positions taken by the liquid column by the processing liquid Lq and positions taken up by the background part are known in advance in the discharge determination region Rj, it is effective to compare the luminance summation values S(i) between the pixel columns located at the respective positions. For example, if the discharge determination region Rj is so set that the flow-down path is located in a central part in the X-direction, a difference between the luminance summation value of the pixel column located in the central part of the discharge determination region Rj in the X-direction and the luminance summation value of the pixel column located in a peripheral part in the X-direction can be set as the evaluation value. Further, if the pixel column on the left end of the discharge determination region Rj corresponds to the liquid column part and the pixel column on the right end corresponds to the background part, a difference between the luminance summation value S(0) of the pixel column on the left end and the luminance summation value S(x) of the pixel column on the right end can be set as the evaluation value. In these cases, a total or average value of the luminance summation values of a plurality of pixel columns proximate to each other, e.g. successive one after another may be used instead of the luminance summation value of one pixel column.

Further, as shown in FIG. 13C, a standard deviation σ when a plurality of luminance summation values S(i) obtained for the respective pixel columns constitute a population may be set as the evaluation value. As shown in FIG. 12B, a variation of the luminance summation value S(i) is relatively small if the discharge determination region Rj includes no image of the processing liquid, and the luminance summation value S(i) largely varies depending on the coordinate value i if the image of the processing liquid is included. Accordingly, the standard deviation σ among the luminance summation values S(i) of the respective pixel columns is a large value when the image of the processing liquid is included in the discharge determination region Rj and is a small value when the image of the processing liquid is not included. Thus, a value of this standard deviation σ can be an evaluation value quantitatively indicating the change mode of the luminance summation value S(i). The standard deviation σ of the luminance summation values S(i) as the population is expressed by the following equation (Equation 2). In (Equation 2), a symbol m denotes an average value of the luminance summation values S(i).

$$\sigma^2 = \frac{1}{x+1} \sum_{i=0}^{x} (S(i) - m)^2 \quad \text{(Equation 2)}$$

Although the value of the standard deviation is used as the evaluation value in the discharge determination processing described next, the evaluation value is not limited to this. The preparatory processing described above may be so configured that a threshold value (threshold value for discharge determination) corresponding to the adopted evaluation value is appropriately set.

FIG. 14 is a flow chart showing the discharge determination processing. At first, an image of one frame is obtained by the camera 72 (Step S401). The image processor 86 segments a partial region corresponding to the discharge determination region Rj from the obtained image (Step S402). The calculator 811 integrates the luminance value of each pixel constituting the discharge determination region Rj for each pixel column (Step S403). The calculator 811 further calculates the standard deviation σ of the luminance summation values as the evaluation value (Step S404).

The determiner 812 compares the value of the standard deviation σ as the evaluation value with the threshold value for discharge determination set in the preparatory processing beforehand (Step S405). If the value of the standard deviation σ is larger than the threshold value for discharge determination (YES in Step S405), the presence of the flow-down of the processing liquid from the nozzle 43 is determined (Step S406). If the evaluation value is not larger than the threshold value for discharge determination (NO in Step S405), the absence of the flow-down of the processing liquid from the nozzle 43 is determined (Step S407). In this way, the presence or absence of the flow-down of the processing liquid is determined in the image of this frame. The above processing is repeated until a timing at which the discharge determination should be finished (Step S408) and the discharge determination is executed for an image of each frame.

Next, how to set the reference value used in discharge determination is described. As described thus far, the discharge determination processing is performed based on the magnitude of the index value obtained from the pixel values of the pixels in the discharge determination region Rj. This utilizes noticeable differences in image content in the discharge determination region Rj between a discharge state where the processing liquid Lq is discharged from the nozzle 43 and a non-discharge state where the processing liquid Lq is not discharged. Specifically, an index value is introduced which has such a property that a value largely differs according to differences in image content between the discharge state and the non-discharge state. By the comparison of the index value and the reference value, the presence or absence of the discharge of the processing liquid Lq from the nozzle 43 is determined.

Thus, the reference value has only to be set on a boundary between a possible numerical range of the index value obtained from the pixel values of the pixels in the discharge determination region Rj in an image imaged in the discharge state and a possible numerical range of the index value obtained from the pixel values of the pixels in the discharge determination region Rj in an image imaged in the non-discharge state.

Figure 15A:
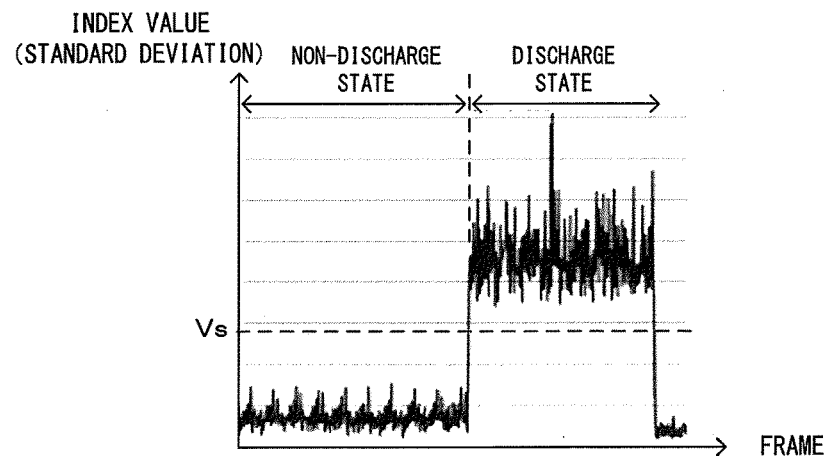
FIGS. 15A, 15B and 15C are graphs showing changing modes of index values obtained from a discharge determination region of an image.
Figure 15B:
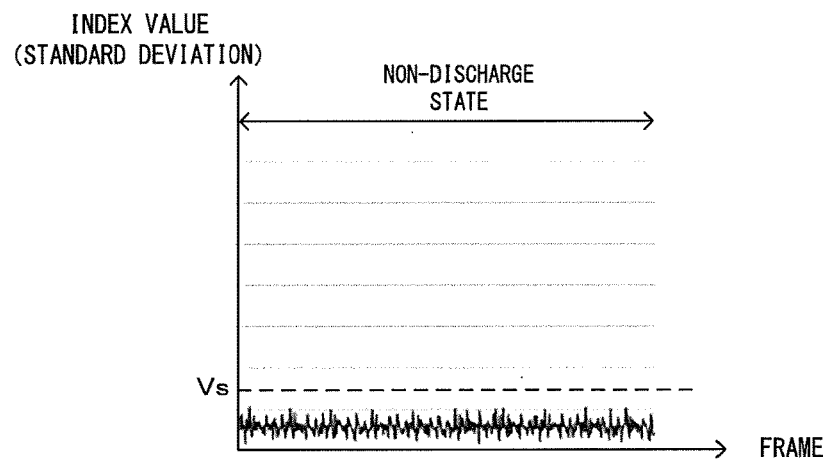
Figure 15C:
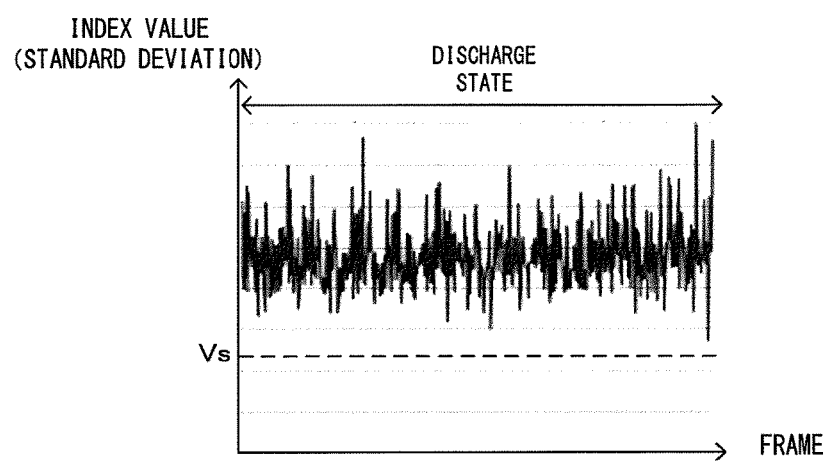

FIGS. 15A, 15B and 15C are graphs showing changing modes of index values obtained from a discharge determination region of an image. More specifically, in these graphs, an index value obtained from the discharge determination region of each of images of a plurality of frames regularly imaged at a fixed time interval is plotted frame by frame. Here, the standard deviation of the aforementioned luminance integration value is used as the index value, but a similar way of thinking holds if the index value is larger in the discharge state than in the non-discharge state.

For example, from the perspective that the processing liquid Lq discharged from the nozzle 43 exhibits a particularly high luminance in the image by reflecting illumination light, the same holds true also when the number of high-luminance pixels having a predetermined luminance value or higher in the discharge determination region Rj or a total area of those pixels is set as the index value.

If the discharge state where the processing liquid Lq is discharged from the nozzle 43 and the non-discharge state where the processing liquid Lq is not discharged are mixed between successive periodical imaging operations as shown in FIG. 15A, a clear difference appears in a distribution of the index value (standard deviation of the luminance integration value) between those states. Specifically, since the index value is small and there is no large change in image content in the discharge determination region Rj in the non-discharge state, a variation of the index value with time is also small. In contrast, the index value is larger in the discharge state as described above. Further, due to a small variation of the discharge amount, the fluctuation of the liquid column surface or the like, a variation of the index value with time becomes larger.

Figure 16A:
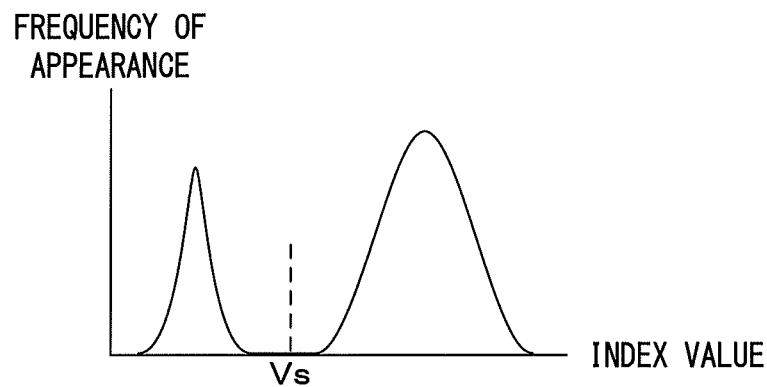
FIGS. 16A, 16B and 16C are graphs schematically showing variations of the index values obtained from a plurality of images.
Figure 16B:
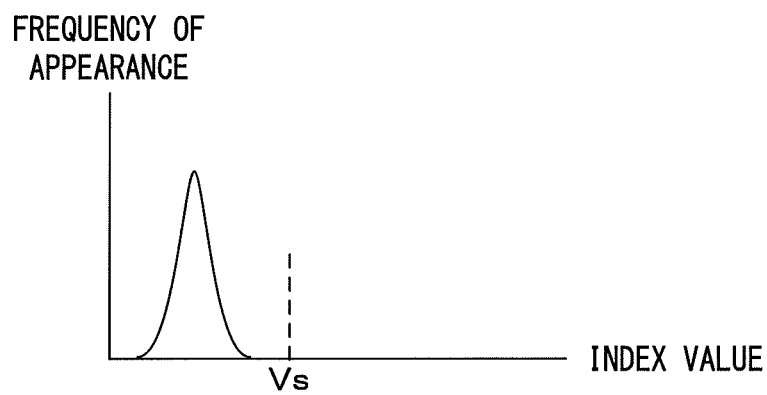
Figure 16C:
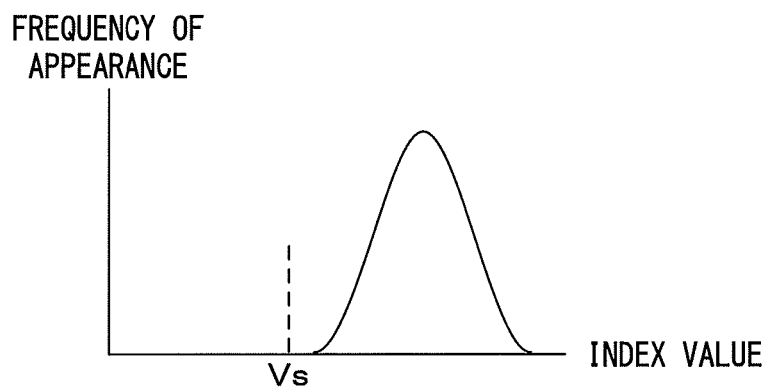

FIGS. 16A, 16B and 16C are graphs schematically showing variations of the index values obtained from a plurality of images. More specifically, these are histograms showing distribution modes of sets having a plurality of index values obtained from a discharge determination region of each of images of a plurality of frames periodically imaged at a fixed time interval as elements. FIG. 16A corresponds to an example of FIG. 15A. As shown in FIG. 16A, the histogram indicated by the index values exhibits bimodality having a peak corresponding to the non-discharge state and having a narrow width appearing in a range of relatively small values and a peak corresponding to the discharge state and having a wide width appearing in a range of larger values. In such a case, if a reference value Vs is set at the position of a valley between two peaks, the discharge state and the non-discharge state can be discriminated based on whether an index value obtained from an image to be determined is larger or smaller than the reference value Vs.

If the nozzle 43 is positioned in advance at the processing position to realize the discharge state and the non-discharge state and the index values are obtained from the discharge determination regions Rj of a multitude of images collected in each state are statistically processed, it is possible to derive a proper reference value Vs. However, it is difficult in some cases to collect images under such a condition. For the non-discharge state, images can be collected such as when the nozzle position is taught in the aforementioned preparation processing. On the other hand, the nozzle 43 needs to actually discharge the processing liquid to realize the discharge state, and it may be difficult to realize such as when the processing liquid is expensive drug or is corrosive. Besides, a processing recipe of moving the nozzle 43 to the processing position while discharging the processing liquid is also possible, but the discharge state is continued and the non-discharge state is not realized in such a case.

As shown in FIG. 15B, index values obtained from images of a plurality of frames imaged in the non-discharge state are relatively small and a variation thereof is also small. Thus, as shown in FIG. 16B, the histogram of the index values exhibits unimodality having a single peak at a position corresponding to a relatively small index value. In this case, a value slightly larger than a distribution range of the index values may be, in principle, set as the reference value Vs. On the other hand, index values obtained from images of a plurality of frames imaged in the discharge state are relatively large and a variation thereof is also large as shown in FIG. 15C. Thus, as shown in FIG. 16C, the histogram of the index values exhibits unimodality having a single peak at a position corresponding to a relative large index value. In this case, a value slightly smaller than a distribution range of the index values may be, in principle, set as the reference value Vs.

However, if the histogram of the index values obtained from the plurality of collected images exhibits unimodality, the reference value Vs cannot be obtained from the histogram unless it is known to which of the non-discharge state and the discharge state the appearing single peak corresponds. As just described, it is difficult to uniquely determine the reference value Vs unless it is possible to realize both the non-discharge state and the discharge state and collect images in advance.

From this, a method capable of properly setting the reference value Vs from a plurality of images collected beforehand regardless of the non-discharge state or the discharge state is required. For this purpose, in this embodiment, reference value setting processing described below is performed before the discharge determination is actually made. Specifically, the reference value setting processing (Step S308) is performed as a part of the preparation processing shown in FIG. 10.

Figure 17:
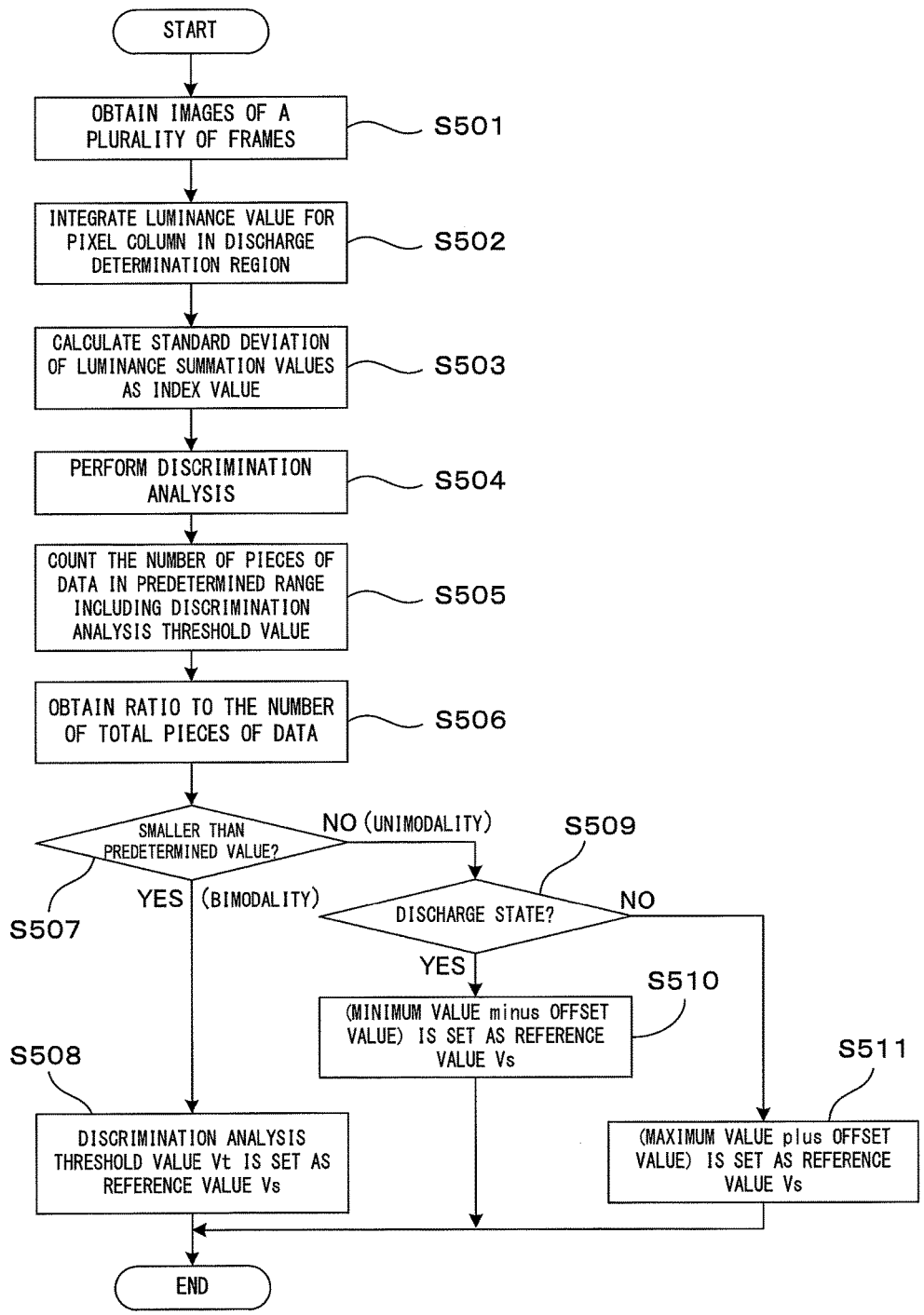
FIG. 17 is a flow chart showing the reference value setting processing.

FIG. 17 is a flow chart showing the reference value setting processing. First, a plurality of frames of images are obtained at mutually different imaging times (Step S501). Imaging for obtaining the image can be performed at an appropriate timing prior to actual discharge determination such as during a teaching operation by an operator or a test operation of the apparatus. It does not matter whether or not the processing liquid is actually discharged at that time.

A luminance integration value of each pixel column in the discharge determination region Rj is obtained for each of the plurality of images thus collected in the same manner as during the discharge determination processing (Step S502). Then, a standard deviation of the luminance integration value is obtained as the index value of this discharge determination region Rj (Step S503). Note that the index value may be other than the standard deviation of the luminance integration value.

Subsequently, to judge whether a histogram of the index values obtained as described above exhibits bimodality or unimodality, appropriate threshold value processing based on the histogram of the index values is performed and the presence or absence of a threshold value dividing two peaks is judged. In this embodiment, discrimination analysis processing into two classes is performed as an example of the threshold value processing (Step S504) and such a threshold value as to maximize a degree of separation between classes (hereinafter, referred to as a "discrimination analysis threshold value") is obtained.

Figure 18A:
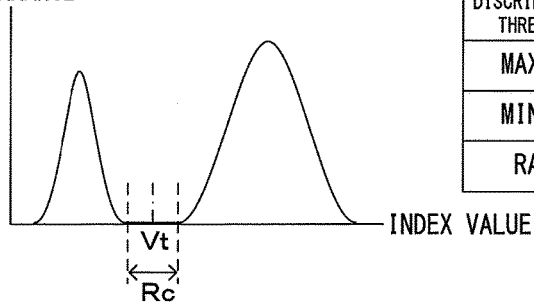
FIGS. 18A, 18B and 18C are graphs showing relationships between the shapes of histograms and numerical values obtained therefrom.
Figure 18B:
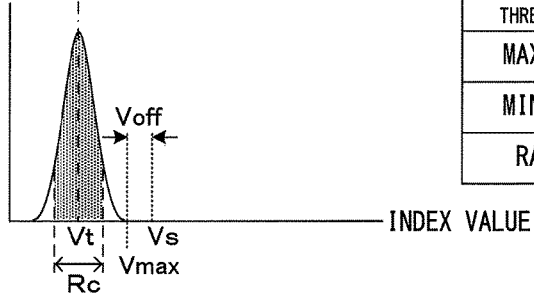
Figure 18C:
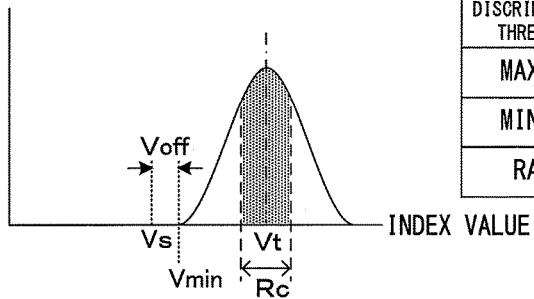

FIGS. 18A, 18B and 18C are graphs showing relationships between the shapes of histograms and numerical values obtained therefrom. If the histogram is bimodal as shown in a left side of FIG. 18A, a discrimination analysis threshold value Vt is a value substantially indicating the position of a valley between two peaks. Thus, a frequency of appearance of index value data is relatively low near the discrimination analysis threshold value Vt. On the other hand, if the histogram is unimodal as shown in a left side of FIG. 18B or 18C, the discrimination analysis threshold value is a value substantially indicating the position of a single peak. Thus, a frequency of appearance of index value data is relatively high near the discrimination analysis threshold value Vt. From this, it is possible to judge whether the histogram is unimodal or bimodal based on how many pieces of index value data are present in a predetermined range Rc including the discrimination analysis threshold value Vt in the histogram.

Specifically, the number of pieces of index value data in the predetermined range Rc including the discrimination analysis threshold value Vt obtained at the index value is counted (Step S505) and a ratio of this number to the number of total pieces of data is obtained (Step S506). If the obtained ratio is smaller than a predetermined value (YES in Step S507), the number of pieces of data near the discrimination analysis threshold value Vt can be said to be small. In an example shown on a right side of FIG. 18A, the data ratio in the range Rc including the discrimination analysis threshold value Vt is almost 0%. If the number of pieces of data near the discrimination analysis threshold value Vt is small in this way, the histogram is estimated to be bimodal. In this case, since the discrimination analysis threshold value Vt is thought to indicate a significant boundary between two classes of the discharge state and the non-discharge state, the discrimination analysis threshold value Vt can be set as the reference value Vs (Step S508).

On the other hand, if the obtained ratio is larger than the predetermined value (NO in Step S507), it indicates that many pieces of the index value data are present near the discrimination analysis threshold value. Thus, the histogram is estimated to be unimodal and the discrimination analysis threshold value is estimated to correspond to the position of the single peak. In this case, it is necessary to judge to which of the discharge state and the non-discharge state the single peak corresponds (Step S509).

FIG. 18B schematically shows an example of a peak corresponding to the non-discharge state. As numerical examples are shown on a right side of FIG. 18B, the peak in this case appears at a position where the index value is relatively small, has a small spread and is sharp. On the other hand, FIG. 18C schematically shows an example of a peak corresponding to the discharge state. As numerical examples are shown on a right side of FIG. 18C, the peak in this case appears at a position where the index value is relatively large and is more moderate. As just described, although these are examples showing similar unimodality, how a peak appears is remarkably different between the discharge state and the non-discharge state.

Accordingly, by introducing an appropriate evaluation value indicating a peak position or the sharpness of a peak, it is possible to judge to which of the discharge state and the non-discharge state this peak corresponds by the comparison of the evaluation value and a threshold value given in advance. The discrimination analysis threshold value Vt obtained by the discrimination analysis can be, for example, used as the evaluation value indicating the peak position. Further, an inverse of the data ratio in the range Rc described above, a half width of the peak or the like can be, for example, used as the evaluation value indicating the sharpness of the peak. Since the data ratio described above is a value which becomes larger as the peak becomes sharper, an inverse thereof can be, for example, an evaluation value which becomes smaller as the peak becomes sharper.

A threshold value can be set for the evaluation value, for example, as follows. The position and the sharpness of the peak in the discharge state relatively largely vary depending on the type and the discharge amount of the processing liquid designated in the processing recipe. In contrast, the position and the sharpness of the peak in the non-discharge state are not affected very much by the processing recipe. It is far easier to empirically realize the non-discharge state than to realize the discharge state where the processing liquid is consumed. From this, the threshold value may be set such that judgment result in Step S509 based on the evaluation value obtained in advance under a condition that the non-discharge state is reliably set is the "non-discharge state" in all cases. Further, since the evaluation value in the non-discharge state differs to a small degree depending on the processing recipe and between individual apparatuses and reproducibility is relatively high, a proven threshold value used in the processing recipe prepared in the past or in another individual apparatus may be used.

Referring back to FIG. 17, the reference value setting processing is further described. Whether the discharge state or the non-discharge state is set is judged based on the obtained evaluation value (Step S509). In the case of, for example, using the discrimination analysis threshold value Vt corresponding to the peak position as the evaluation value or in the case of using an inverse of the data ratio in the range Rc or a half width of the peak corresponding to the sharpness of the peak as the evaluation value, the non-discharge state is judged if the evaluation value is smaller than the threshold value and the discharge state is judged if the evaluation value is larger than the threshold value. If the evaluation value indicates a larger value as the peak becomes sharper, the non-discharge state is judged if the evaluation value is larger than the threshold value and the discharge state is judged if the evaluation value is smaller than the threshold value conversely to the above.

If the single peak of the histogram is judged to correspond to the discharge state (YES in Step S509), a value obtained by subtracting a predetermined offset value Voff (≥0) from a minimum value Vmin of the index values of the collected images can be set as the reference value Vs (Step S510) as shown in FIG. 18C. If the index values include a value seen to be peculiar due to an unexpected event such as image noise or a variation of the discharge amount, the substantially minimum value Vmin may be selected after excluding such a value. By further subtracting the offset value Voff from the thus selected minimum value Vmin, a certain margin for erroneous determination of determining the non-discharge state although the discharge state is set can be given to the reference value Vs.

On the other hand, if the single peak of the histogram is judged to correspond to the non-discharge state (NO in Step S509), a value obtained by adding a predetermined offset value Voff to a maximum value Vmax of the index values of the collected images can be set as the reference value Vs (Step S511) as shown in FIG. 18B. Also in this case, processing may be performed to exclude a peculiar value included in the index values from candidates for the maximum value and select the substantially maximum value. Further, also in this case, a certain margin for erroneous determination can be given to the reference value Vs by adding the offset value Voff. Note that the offset values Voff used in the calculations of Steps S510 and S511 need not be equal.

In this way, the reference value Vs is set. In the reference value setting processing shown in FIG. 17, the reference value Vs can be set to a proper value by the same processing regardless of whether the plurality of collected images correspond to the discharge state where the processing liquid Lq is discharged from the nozzle 43, correspond to the non-discharge state where the processing liquid Lq is not discharged or corresponds to the mixture of those states. By performing the discharge determination processing (FIG. 14) using the reference value Vs set beforehand in this way, the presence or absence of the discharge of the processing liquid from each nozzle 33, 43, 53 can be precisely determined only from a single frame of image in the substrate processing unit 1A.

As described above, in this embodiment, the index value is introduced which quantitatively indicates the image content in the discharge determination region Rj corresponding to the flow-down path of the processing liquid Lq discharged from the nozzle 43 out of the image obtained by imaging the interior of the chamber 90. The index value is a numerical value obtained from the luminance value of each pixel in the discharge determination region Rj and is defined to be larger in the discharge state where the processing liquid Lq is discharged from the nozzle 43 than in the non-discharge state where the processing liquid is not discharged.

The reference value Vs is set according to the shape of the histogram formed by a plurality of index values obtained from a plurality of images collected in advance. Specifically, when the histogram exhibits bimodality, it is assumed that the collected images include both images of the discharge state and those of the non-discharge state and two peaks appear to correspond to such a condition. Accordingly, in this case, the index value corresponding to the position of a value between the two peaks is set as the reference value Vs. Specifically, the discrimination analysis threshold value Vt obtained by the discrimination analysis of two classes based on the plurality of index values is set as the reference value Vs.

On the other hand, when the histogram exhibits unimodality, the evaluation value indicating the position of a single peak or the sharpness of that single peak is further introduced. When the single peak corresponds to the non-discharge state, the peak appears at a position where the index value is relatively small, and is relatively steep. In contrast, when the peak corresponds to the discharge state, the peak appears at a position where the index value is relatively large, and has a relatively wide width. Thus, the evaluation value indicating the peak position or the sharpness of the peak is introduced and the evaluation value and the threshold value determined in advance are compared. By doing so, it is possible to judge to which of the non-discharge state and the discharge state the single peak appearing in the histogram corresponds.

If the single peak corresponds to the non-discharge state, a value obtained by adding the offset value to the maximum value of the index values is set as the reference value Vs. Further, if the single peak corresponds to the discharge state, a value obtained by subtracting the offset value from the minimum value of the index values is set as the reference value Vs. As just described, the reference value Vs can be properly set in this embodiment even if all the plurality of collected images correspond to either one of the discharge state and the non-discharge state.

In this way, the reference value Vs for the discharge determination of the processing liquid Lq from one nozzle 43 is set. A reference value can be set for each of the other nozzles 33, 53 by performing similar processing. However, it is also possible to use the reference value Vs set for one nozzle 43 for the other nozzles. Specifically, in this embodiment, it is determined whether or not the liquid is present in the discharge determination region Rj against the surface of the substrate W as a background and this determination basically does not depend on the shape and the position of the nozzle. Thus, the reference value set for one nozzle can be applied also for discharge determination for the other nozzles as it is or by being multiplied by an appropriate coefficient or added with an offset value unless the illumination conditions and conditions such as the color of the processing liquid largely change.

As described above, in this embodiment, each of the substrate processing units 1A, 1B, 1C and 1D corresponds to a "discharge apparatus" of the invention, and the substrate W corresponds to a "work" of the invention. In the substrate processing unit 1A, the spin chuck 11 functions as a "holder" of the invention and each of the nozzles 33, 43 and the 53 functions as a "nozzle" of the invention. Further, the controller 80 has functions as a "discharge determiner" and a "controller" of the invention. Further, the discharge determination region Rj corresponds to an "evaluation area" of the invention.

Note that the invention is not limited to the above embodiment and various changes other than those described above can be made without departing from the gist of the invention. For example, in the above embodiment, the discharge determination method according to the invention is applied to the discharge apparatus in which the processing liquid Lq is discharged vertically downward from the nozzle 43. However, the liquid discharging direction is not limited to the vertical direction and the discharge determination method according to the invention can be applied to liquid discharged in any direction. Further, the discharge determination method according to the invention can be suitably applied not only when the liquid is discharged in the form of a liquid column, but also when the liquid is intermittently discharged or discharged in the form of droplets.

Further, in the above embodiment, the Y direction of the image matches the flow-down direction of the liquid and the discharge determination region Rj has a rectangular shape whose sides extend in the X and Y directions. Thus, the number of the pixels constituting each pixel column along the Y direction is fixed regardless of the X-direction position. Therefore, the luminance integration values of the respective pixel columns can be simply compared in the X direction. On the other hand, if the numbers of the pixels constituting the pixel columns are not fixed, correction such as normalization by dividing the luminance integration values by the numbers of pixels is necessary.

Further, in the above embodiment, the nozzle movement instruction and the processing liquid discharge instruction issued from the CPU 81 are executed in accordance with a sequence determined in advance to improve the throughput of the processing. Instead of this, such a process is also conceivable in which an advance is made to the next step while a state of the apparatus is confirmed in each step such as the issuance of a discharge instruction after the confirmation of the position of the nozzle. The discharge determination method according to the invention effectively functions also in such a process.

Further, the substrate processing unit 1A and the like of the above embodiment are incorporated with the discharge determination processing, to which the discharge determination method according to the invention is applied. However, it is also possible to apply the invention to a substrate processing apparatus not having such discharge determination processing by newly mounting a control program describing each process of the discharge determination processing including separately set reference values in the substrate processing apparatus. To this end, the discharge determination method according to the invention may be provided as a control program described to cause a computer to execute each step thereof or a computer-readable recording medium recording this control program.

As the specific embodiment is illustrated and described above, the discharge determination method according to the invention may be configured such that, when the histogram exhibits bimodality, an index value corresponding to a valley between two peaks is set as a reference value. Since the two peaks appearing in the histogram are assumed to correspond to the discharge state and the non-discharge state, it is rational to assume that the boundary between the discharge state and the non-discharge state is present at the valley between those.

Further, for example, an index value having a maximum degree of separation between classes is obtained by the discrimination analysis of two classes for a set of index values obtained for each of a plurality of images and whether or not a histogram is unimodal may be judged based on a ratio of the number of elements in a predetermined numerical range including the obtained value to the set. In this case, the above ratio can be used as an evaluation value indicating the sharpness of a peak. If a histogram is bimodal, a threshold value of an index value having a maximum degree of separation between the discharge state and the non-discharge state is obtained by performing the discrimination analysis and the number of elements near this threshold value is small. On the other hand, if a histogram is unimodal, a threshold value of an index value obtained by the discrimination analysis substantially corresponds to a peak position and many elements are present near the peak position. From this, whether or not a histogram is unimodal can be properly judged based on the number of elements near a threshold value obtained by the discrimination analysis.

Further, for example, the index value may be a value corresponding to a value of a population standard deviation when a set of total values which are obtained by individually totaling pixel values for each pixel column composed of pixels arranged along a liquid flowing direction in the evaluation area is a population. According to such a configuration, by integrating the pixel values along the liquid flowing direction, a characteristic change of the pixel values caused by the flow of the liquid is emphasized and the presence or absence of the liquid can be more accurately determined.

Further, for example, the index value may be a value corresponding to the number of pixels having pixel values corresponding to luminances higher than a predetermined luminance in the evaluation area. Generally, when liquid is discharged from a nozzle, illumination light and ambient light are reflected by the liquid and reflected in an image, whereby there are more high-luminance areas in the evaluation area than in the non-discharge state. Thus, the number of pixels having the luminances higher than the predetermined luminance in the evaluation area can be suitably utilized as the index value.

Further, the discharge apparatus according to the invention may be configured to include a controller which controls the discharge of the liquid from the nozzle and determines an abnormality of the nozzle based on the determination result of the discharge determiner. According to this configuration, the presence or absence of the abnormality of the nozzle can be precisely determined by grasping the presence or absence of the discharge of the liquid from the nozzle as described above.

This invention can be suitably applied, for example, to a processing apparatus for performing wet processing by supplying processing liquid to a substrate. However, the invention can be applied to determine a flow-down state of liquid flowing down toward any arbitrary work without limitation to substrates.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A discharge determination method for determining whether a discharge state where liquid is discharged from a nozzle or a non-discharge state where the liquid is not discharged from the nozzle is set, the discharge determination method comprising:

performing imaging to obtain an image of an imaging field of view, wherein said discharged liquid flows down a flow-down path, and at least a part of said flow-down path is included in said imaging field of view;

obtaining an index value which is larger in the discharge state than in the non-discharge state based on pixel values of pixels in an evaluation area including at least a part of said image; and determining that the image indicates the discharge state if the index value is larger than a reference value which is determined in advance while determining that the image indicates the non-discharge state if the index value is smaller than the reference value, the reference value being determined based on a histogram indicated by the index values obtained for the evaluation area of each of a plurality of images including the evaluation areas imaged at mutually different times, wherein when the histogram exhibits unimodality:

if an evaluation value indicated by either the index value corresponding to the position of a peak or a value indicating the sharpness of the peak is smaller than a threshold value determined in advance, a value corresponding to a substantially maximum value of the index values in the histogram is set as the reference value; and if the evaluation value is larger than the threshold value, a value corresponding to a substantially minimum value of the index values in the histogram is set as the reference value; and wherein when the histogram exhibits bimodality, the index value corresponding to a valley between two peaks is set as the reference value.

2. The discharge determination method according to claim 1, wherein the index value having a maximum degree of separation between classes is obtained by the discrimination analysis of two classes for a set of index values obtained for each of the plurality of images and whether or not the histogram is unimodal is judged based on a ratio of number of elements in a predetermined numerical range including the obtained value to the set.

3. The discharge determination method according to claim 2, wherein the ratio is used as the evaluation value indicating the sharpness of the peak.

4. The discharge determination method according to claim 1, wherein the index value is a value corresponding to a value of a population standard deviation when a set of total values which are obtained by individually totaling pixel values for each pixel column composed of pixels arranged along a liquid flowing direction in the evaluation area is a population.

5. The discharge determination method according to claim 1, wherein the index value is a value corresponding to the number of pixels having pixel values corresponding to luminance higher than a predetermined luminance in the evaluation area.

6. A discharge determination method for determining whether a discharge state where liquid is discharged from a nozzle or a non-discharge state where the liquid is not discharged from the nozzle is set, the discharge determination method comprising:

performing imaging to obtain an image of an imaging field of view, wherein said discharged liquid flows down a flow-down path, and at least a part of said flow-down path is included in said imaging field of view;

obtaining an index value which is larger in the discharge state than in the non-discharge state based on pixel values of pixels in an evaluation area including at least a part of said image; and determining that the image indicates the discharge state if the index value is larger than a reference value which is determined in advance while determining that the image indicates the non-discharge state if the index value is smaller than the reference value, the reference value being determined based on a histogram indicated by the index values obtained for the evaluation area of each of a plurality of images including the evaluation areas imaged at mutually different times in the non-discharge state, wherein the reference value is a value corresponding to a substantially maximum value of the index values in the histogram.

7. A discharge determination method for determining whether a discharge state where liquid is discharged from a nozzle or a non-discharge state where the liquid is not discharged from the nozzle is set, the discharge determination method comprising:

performing imaging to obtain an image of an imaging field of view, wherein said discharged liquid flows down a flow-down path, and at least a part of said flow-down path is included in said imaging field of view;

obtaining an index value which is larger in the discharge state than in the non-discharge state based on pixel values of pixels in an evaluation area including at least a part of said image; and determining that the image indicates the discharge state if the index value is larger than a reference value which is determined in advance while determining that the image indicates the non-discharge state if the index value is smaller than the reference value, the reference value being determined based on a histogram indicated by the index values obtained for the evaluation area of each of a plurality of images including the evaluation areas imaged at mutually different times in the discharge state, wherein the reference value is a value corresponding to a substantially minimum value of the index values in the histogram.

* * * * *